(12) United States Patent
Nishikawa et al.

(10) Patent No.: US 9,935,123 B2
(45) Date of Patent: Apr. 3, 2018

(54) WITHIN ARRAY REPLACEMENT OPENINGS FOR A THREE-DIMENSIONAL MEMORY DEVICE

(71) Applicant: SANDISK TECHNOLOGIES LLC, Plano, TX (US)

(72) Inventors: Masatoshi Nishikawa, Yokkaichi (JP); Masafumi Miyamoto, Yokkaichi (JP); James Kai, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/219,652

(22) Filed: Jul. 26, 2016

(65) Prior Publication Data

US 2017/0148808 A1    May 25, 2017

Related U.S. Application Data

(60) Provisional application No. 62/259,750, filed on Nov. 25, 2015.

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/28273* (2013.01); *H01L 21/28282* (2013.01);
(Continued)

(58) Field of Classification Search
CPC ......... H01L 27/11551; H01L 27/11553; H01L 27/11556; H01L 27/11578; H01L 27/1158;
(Continued)

(56) References Cited

U.S. PATENT DOCUMENTS 5,915,167 A    6/1999    Leedy
7,575,973 B2   8/2009    Mokhlesi et al.
(Continued)

OTHER PUBLICATIONS

International Search Report and Written Opinion of the International Search Authority for International Application No. PCT/US2016/050427, dated Jan. 17, 2017, 17 pages.
(Continued)

*Primary Examiner* — Matthew Landau
*Assistant Examiner* — Scott Stowe
(74) *Attorney, Agent, or Firm* — The Marbury Law Group PLLC

(57) ABSTRACT

An alternating stack of sacrificial material layers and insulating layers is formed over a substrate. Replacement of sacrificial material layers with electrically conductive layers can be performed employing a subset of openings. A predominant subset of the openings is employed to form memory stack structures therein. A minor subset of the openings is employed as access openings for introducing an etchant to remove the sacrificial material layers to form lateral recesses and to provide a reactant for depositing electrically conductive layers in the lateral recesses. By distributing the access openings across the entirety of the openings and eliminating the need to employ backside trenches for replacement of the sacrificial material layers, the size and lateral extent of backside trenches can be reduced to a level sufficient to accommodate only backside contact via structures.

13 Claims, 28 Drawing Sheets

(51) Int. Cl.
| | |
|---|---|
| H01L 23/528 | (2006.01) |
| H01L 27/11556 | (2017.01) |
| H01L 29/06 | (2006.01) |
| H01L 21/28 | (2006.01) |
| H01L 21/311 | (2006.01) |
| H01L 23/522 | (2006.01) |
| H01L 27/11519 | (2017.01) |
| H01L 27/11521 | (2017.01) |
| H01L 27/11526 | (2017.01) |
| H01L 27/11565 | (2017.01) |
| H01L 27/11568 | (2017.01) |
| H01L 27/11573 | (2017.01) |
| H01L 29/08 | (2006.01) |
| H01L 27/1157 | (2017.01) |

(52) U.S. Cl.
CPC ...... *H01L 21/31111* (2013.01); *H01L 23/528* (2013.01); *H01L 23/5226* (2013.01); *H01L 27/1157* (2013.01); *H01L 27/11519* (2013.01); *H01L 27/11521* (2013.01); *H01L 27/11526* (2013.01); *H01L 27/11556* (2013.01); *H01L 27/11565* (2013.01); *H01L 27/11568* (2013.01); *H01L 27/11573* (2013.01); *H01L 29/0649* (2013.01); *H01L 29/0847* (2013.01)

(58) Field of Classification Search
CPC ......... H01L 27/11582; H01L 27/11517; H01L 27/11519; H01L 27/11565; H01L 21/28282; H01L 21/28273
See application file for complete search history.

(56) References Cited

U.S. PATENT DOCUMENTS

| | | | |
|---|---|---|---|
| 7,906,392 | B2 | 3/2011 | Dunton et al. |
| 8,084,819 | B2 | 12/2011 | Kim et al. |
| 8,187,936 | B2 | 5/2012 | Alsmeier et al. |
| 8,461,641 | B2 | 6/2013 | Alsmeier et al. |
| 8,610,194 | B2 | 12/2013 | Aritome |
| 8,735,962 | B2 | 5/2014 | Whang et al. |
| 8,767,465 | B2 | 7/2014 | Chang et al. |
| 8,823,076 | B2 | 9/2014 | Lee et al. |
| 8,853,765 | B2 | 10/2014 | Lee et al. |
| 8,981,457 | B2 | 3/2015 | Lee et al. |
| 8,987,119 | B2 | 3/2015 | Dunton et al. |
| 9,023,719 | B2 | 5/2015 | Pachamuthu et al. |
| 2007/0029607 | A1 | 2/2007 | Kouznetzov |
| 2007/0252201 | A1 | 11/2007 | Kito et al. |
| 2009/0146206 | A1 | 6/2009 | Fukuzumi et al. |
| 2009/0230454 | A1 | 9/2009 | Pekny |
| 2010/0207194 | A1 | 8/2010 | Tanaka et al. |
| 2010/0213527 | A1 | 8/2010 | Shim et al. |
| 2011/0057251 | A1* | 3/2011 | Higashi ............ H01L 27/11578 257/324 |
| 2011/0156044 | A1 | 6/2011 | Lee et al. |
| 2011/0287612 | A1 | 11/2011 | Lee et al. |
| 2011/0309432 | A1 | 12/2011 | Ishihara et al. |
| 2012/0012921 | A1 | 1/2012 | Liu |
| 2012/0267699 | A1 | 10/2012 | Kiyotoshi |
| 2012/0326221 | A1 | 12/2012 | Sinha |
| 2013/0044531 | A1 | 2/2013 | Baek et al. |
| 2014/0131784 | A1 | 5/2014 | Davis et al. |
| 2015/0044833 | A1 | 2/2015 | Lee et al. |
| 2015/0076584 | A1 | 3/2015 | Pachamuthu et al. |
| 2015/0179660 | A1 | 6/2015 | Yada et al. |
| 2015/0255481 | A1 | 9/2015 | Baenninger et al. |
| 2015/0287710 | A1 | 10/2015 | Yun et al. |
| 2015/0371709 | A1 | 12/2015 | Kai et al. |
| 2016/0071860 | A1 | 3/2016 | Kai et al. |
| 2016/0071861 | A1 | 3/2016 | Serov et al. |
| 2016/0071876 | A1 | 3/2016 | Mizuno et al. |
| 2016/0133642 | A1 | 5/2016 | Jeon et al. |

OTHER PUBLICATIONS

International Search Report and Written Opinion of the International Search Authority for International Application No. PCT/US2016/050432, dated Jan. 31, 2017, 16 pages.
Invitation to Pay Additional Fees and Communication Relating to the Results of the Partial International Search from the International Searching Authority for PCT/US2016/050427, dated Nov. 23, 2016, 9 pages.
U.S. Patent and Trademark Office Non-Final Office Action for U.S. Appl. No. 15/219,719, dated Jul. 14, 2017, 31 pages.
Office Communication for U.S. Appl. No. 14/748,670, 21 pages, dated Jul. 15, 2016.
International Search Report and Written Opinion for PCT/US2015/055559, dated Apr. 7, 2016, 19 pages.
Invitation to Pay Additional Fees and Communication Relating to the Results of the Partial International Search for PCT/US2015/055559, 10 pages, dated Jan. 26, 2016.
International Searching Report and Written Opinion of the International Searching Authority for PCT/US2015/042220, 24 pages, dated Jan. 18, 2016.
Office Communication for U.S. Appl. No. 14/748,575, 20 pages, dated Jul. 15, 2016.
Invitation to Pay Additional Fees and Annex to Form PCT/ISA/206 Communication Relating to the Results of the Partial International Search for PCT/US2015/042220, dated Oct. 13, 2015.
U.S. Appl. No. 14/317,274, filed Jun. 27, 2014, SanDisk Technologies Inc.
U.S. Appl. No. 15/219,719, filed Jul. 26, 2016, SanDisk Technologies Inc.
International Preliminary Report on Patentability and Written Opinion of the International Searching Authority for International Application No. PCT/IB2015/053094 dated Nov. 10, 2016, 11 pages.
Invitation to Pay Additional Fees from the International Searching Authority for International Patent Application No. PCT/US2016/050432, dated Dec. 5, 2016, 8 pages.

* cited by examiner

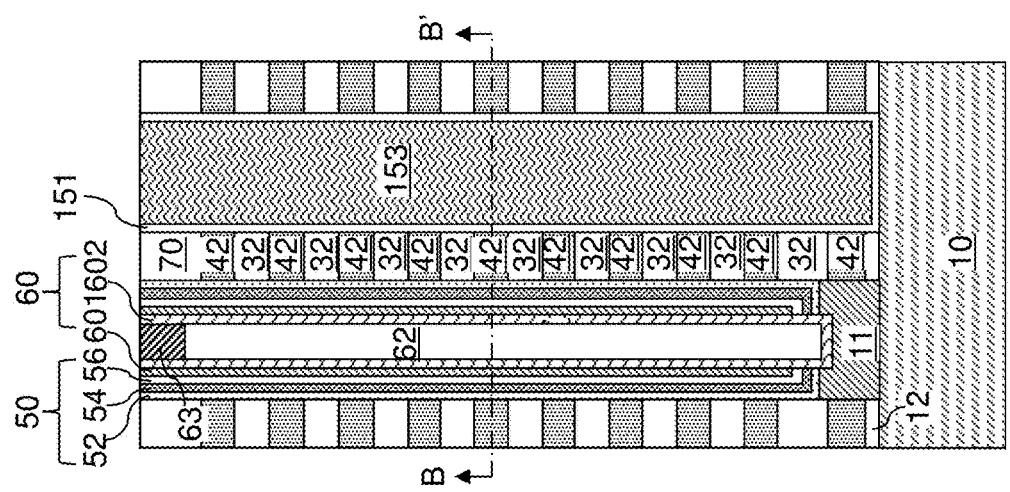
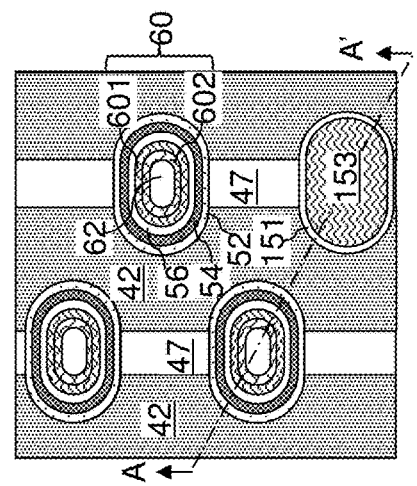
FIG. 8A
FIG. 8B

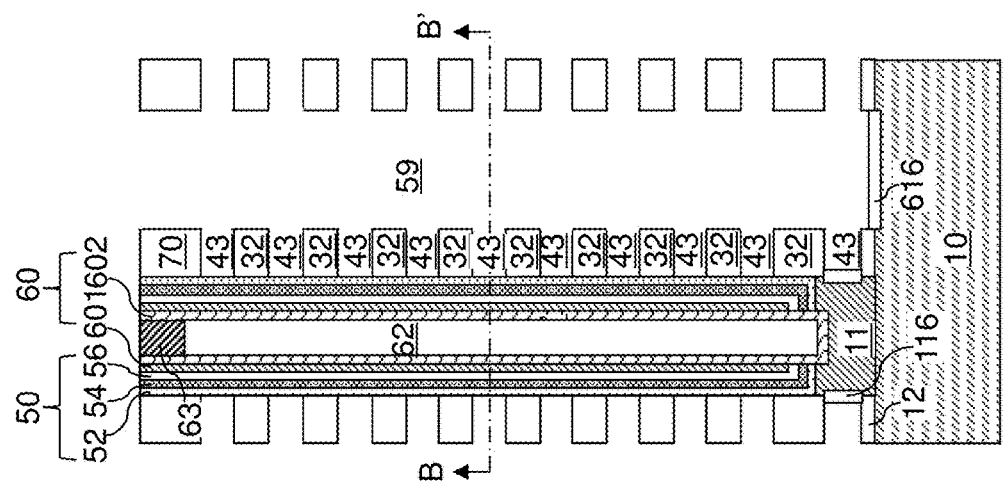
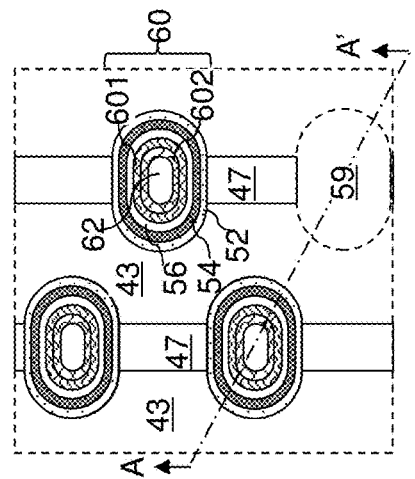
FIG. 10A
FIG. 10B

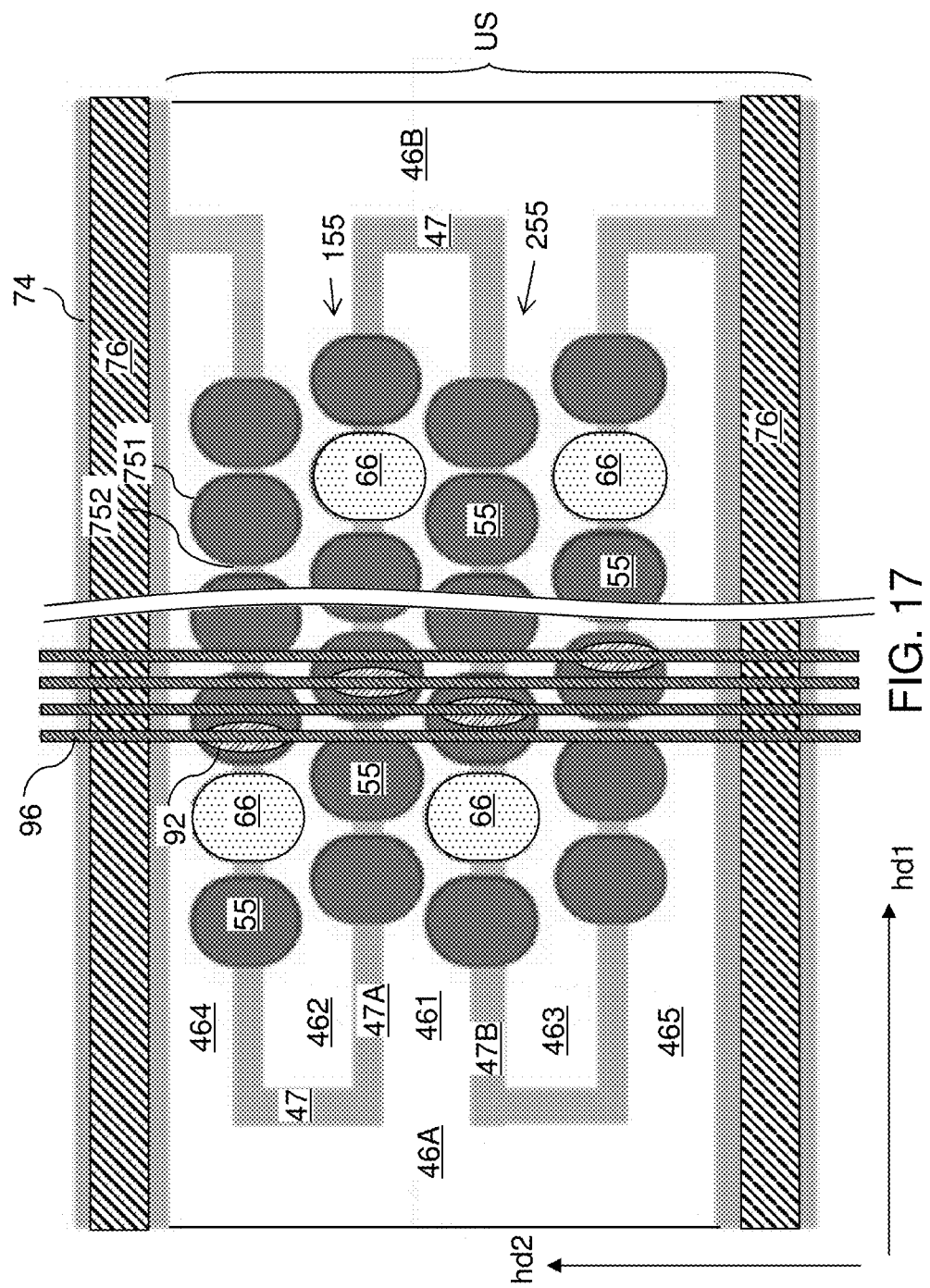

WITHIN ARRAY REPLACEMENT OPENINGS FOR A THREE-DIMENSIONAL MEMORY DEVICE

RELATED APPLICATIONS

This application claims the benefit of priority of U.S. Provisional Application No. 62/259,750 filed on Nov. 25, 2015, which is incorporated herein by reference in its entirety.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A through-stack opening is formed through the layers to define many memory layers simultaneously. A NAND string is then formed by filling the through-stack opening with appropriate materials. A straight NAND string extends in one through-stack opening, while a pipe- or U-shaped NAND string (p-BiCS) includes a pair of vertical columns of memory cells. Control gates of the memory cells may be provided by the conductive layers.

SUMMARY

According to an aspect of the present disclosure, a three-dimensional memory device is provided, which comprises: an alternating stack of insulating layers and electrically conductive layers located over a substrate; an array of openings extending through the alternating stack; a plurality of memory stack structures located in a first subset of the array of openings, wherein each of the plurality of memory stack structures comprises a memory film and a vertical semiconductor channel extending through the alternating stack; and a plurality of dielectric pillar structures located in a second subset of the array of openings.

According to another aspect of the present disclosure, a method of forming a three-dimensional memory device comprises forming an alternating stack of insulating layers and sacrificial material layers over a substrate, forming a first subset of openings of an array of openings through the alternating stack, forming a memory stack structure in each of a first subset of openings, wherein each memory stack structure comprises a memory film and a vertical semiconductor channel extending through the alternating stack, forming a second subset of openings of the array of openings through the alternating stack; removing the sacrificial material layers by introducing an etchant through the second subset of openings to form lateral recesses, and forming electrically conductive layers in the lateral recesses through the second subset of openings.

BRIEF DESCRIPTION OF THE DRAWINGS

FIG. 8A is a vertical cross-sectional view of the region R of the exemplary structure after formation of a second semiconductor channel layer, a dielectric core, and a drain region in each of the first subset of openings according to an embodiment of the present disclosure.

FIG. 8B is a horizontal cross-sectional view of the exemplary structure along the plane B-B' in FIG. 8A. The vertical plane A-A' corresponds to the plane of the vertical cross-sectional view of FIG. 8A.

FIG. 10A is a vertical cross-sectional view of the region R of the exemplary structure after formation of lateral recesses by removal of the sacrificial material layers according to an embodiment of the present disclosure.

FIG. 10B is a horizontal cross-sectional view of the exemplary structure along the plane B-B' in FIG. 10A. The vertical plane A-A' corresponds to the plane of the vertical cross-sectional view of FIG. 10A.

FIG. 17 is a see-through top-down view of the exemplary device structure that illustrates global shapes of various components of the exemplary device structure according to an embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
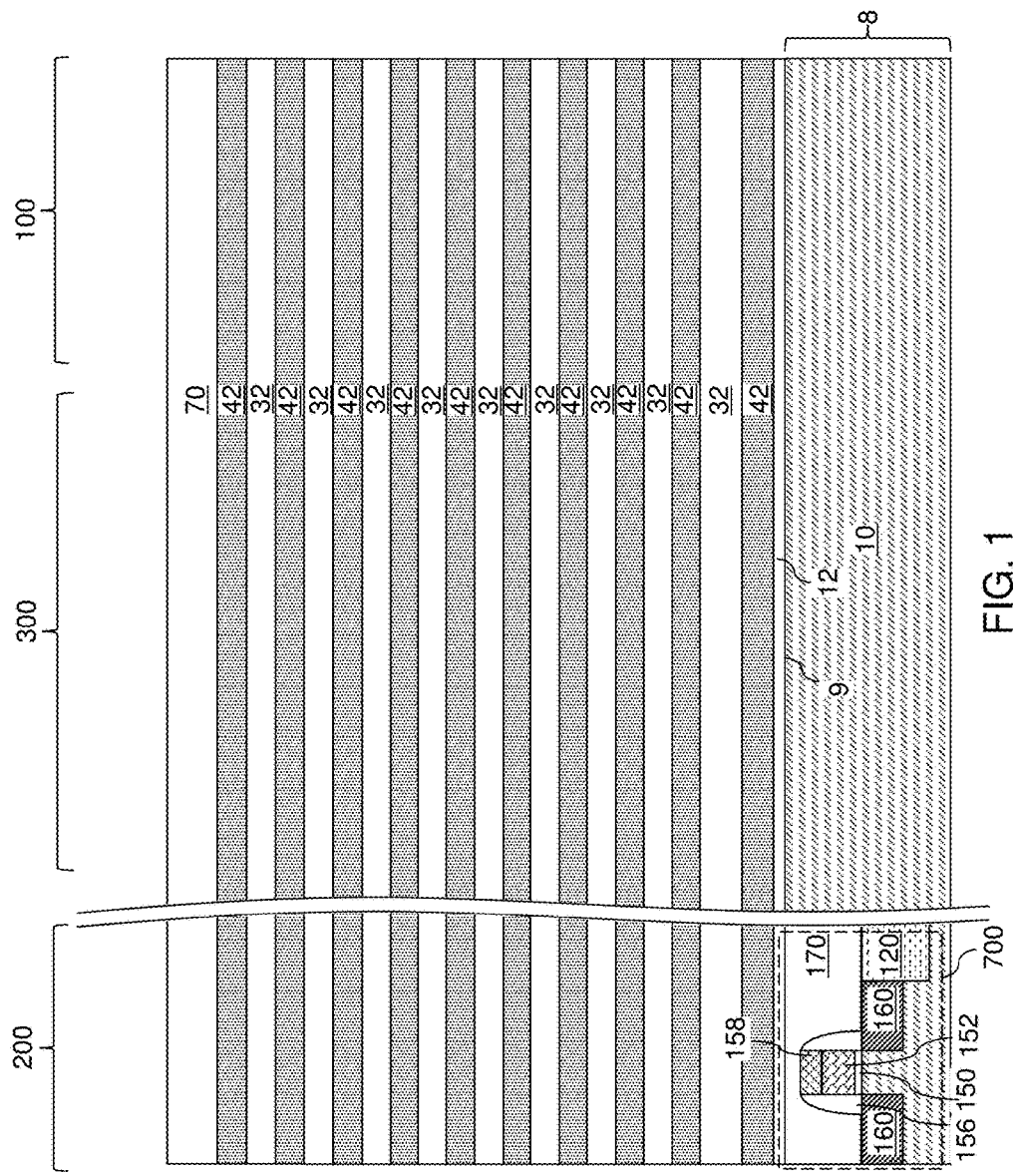
FIG. 1 is a vertical cross-section of an exemplary structure after formation of an alternating stack of insulating layers and spacer material layers according to an embodiment of the present disclosure.

Referring to FIG. 1, an exemplary device structure according to embodiments of the present disclosure is shown, which can be employed to form a 3D NAND stacked memory device. The exemplary device structure includes a substrate 8, which can be a semiconductor substrate. Various semiconductor devices can be formed on, or over, the substrate 8 employing methods known in the art. For example, an array of memory devices can be subsequently formed in a memory array region 100, and at least one peripheral device 700 can be formed in a peripheral device region 200. Electrically conductive via contacts to the electrically conductive electrodes of devices in the memory array region 100 can be subsequently formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

Optionally, a top surface of the semiconductor material layer 10 of the substrate can be recessed in the peripheral device region 200. Alternatively, semiconductor devices can be formed on the top surface of the semiconductor material layer 10 in the peripheral device region 200, and an epitaxial semiconductor material can be grown outside the peripheral device region to add to the material of the semiconductor material layer 10 in the memory array region 100 and the contact region 200.

Formation of semiconductor devices in the peripheral device region 200 can be performed employing various processing steps. The semiconductor devices in the peripheral device region 200 are herein referred to as peripheral devices 700. At least one optional shallow trench isolation structure 120 and/or at least one deep trench isolation structure (not shown) may be employed to provide electrical isolation among various semiconductor devices on the substrate 8. The peripheral devices 700 formed in the peripheral device region 200 can include any device known in the art and needed to support the operation of the semiconductor devices in the memory array region 100. The peripheral devices 700 can include a driver circuit associated with the array of the memory devices in the memory array region 100. The peripheral device 700 can comprise transistor devices in the driver circuit. In one embodiment, the peripheral devices can include one or more field effect transistors, each of which can include active regions 160 (which include a source region and a drain region), a body region (including a portion of the semiconductor material layer 10 located between a respective pair of a source region and a drain region), a gate stack (150, 152, 158), and a gate spacer 156. The gate stack (150, 152, 158) can include any type of gate stack structures known in the art. For example, each gate stack (150, 152, 158) can include, from bottom to top, a gate dielectric 150, a gate electrode 152, and an optional gate cap dielectric 158. Optionally, a planarization dielectric layer 170 including a dielectric material may be employed in the peripheral device region 200 to facilitate planarization of the portion of material stacks to be subsequently formed on the substrate 8. In one embodiment, the planarization dielectric layer 170 can be planarized to provide a top surface of a pre-existing semiconductor material layer 10 in case the peripheral devices 700 are formed within a recessed region of the substrate. Alternatively, the planarization dielectric layer 70 can be planarized to provide a planar top surface located above the horizontal plane including the top surface of a pre-existing semiconductor material layer 10, and an epitaxial semiconductor material can be grown from the top surface of the semiconductor material layer 10 and planarized such that the top surface the planarized semiconductor material layer 10 and the top surface of the planarization dielectric layer 170 are within a same horizontal plane.

Subsequently, a gate dielectric layer 12 can be formed on the top surface of the semiconductor substrate 8. The gate dielectric layer 12 can include any gate dielectric material known in the art. For example, the gate dielectric layer 12 can include a silicon oxide layer, a silicon oxynitride layer, a dielectric metal oxide layer, or a stack thereof. The gate dielectric layer 12 can be formed by deposition of at least one dielectric material and/or thermal or plasma conversion of a surface portion of the semiconductor material layer 10. The thickness of the gate dielectric layer 12 can be in a range from 1 nm to 10 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 9 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
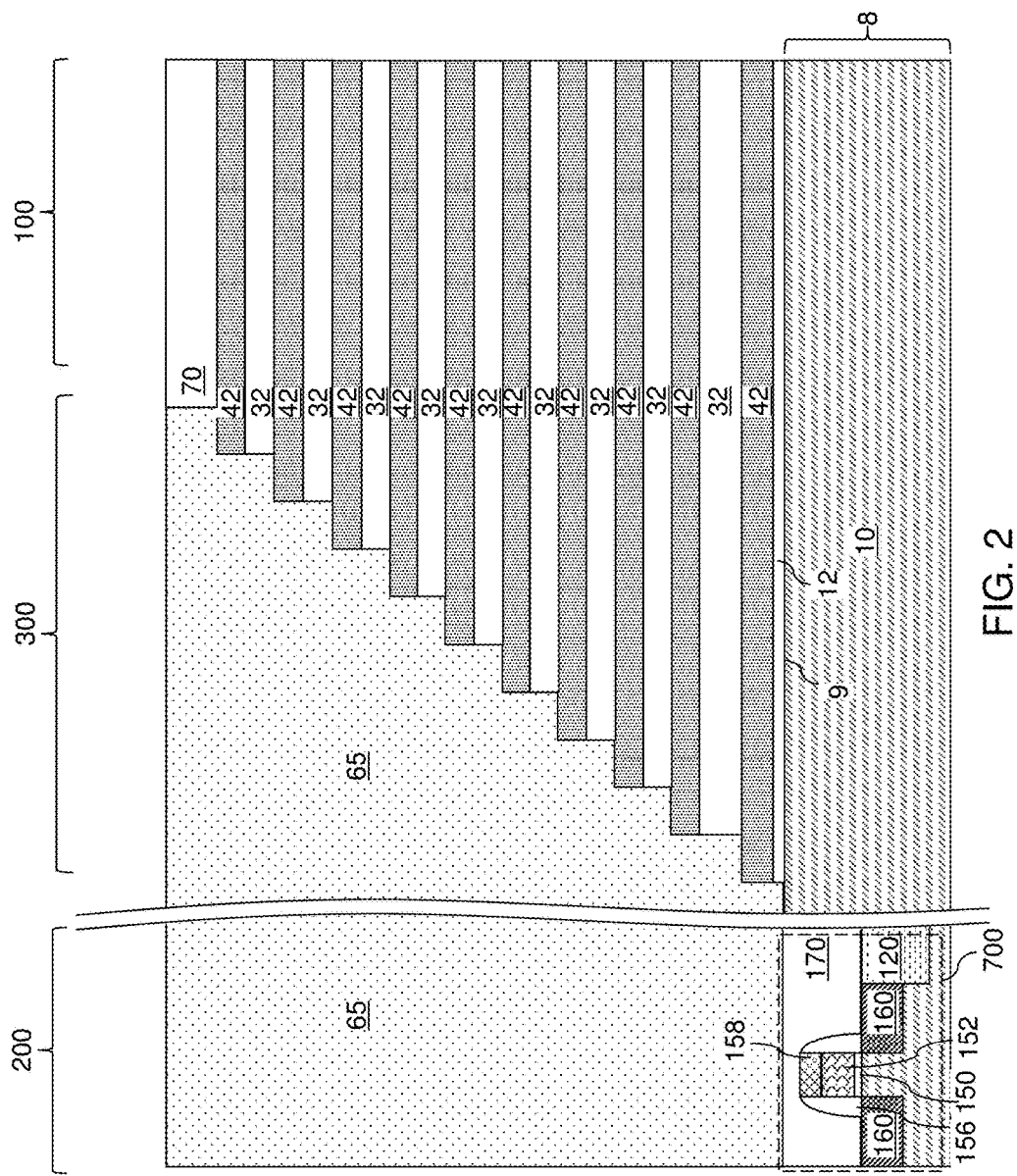
FIG. 2 is a vertical cross-sectional view of the exemplary structure after formation of stepped terraces and a retro-stepped dielectric material portion according to an embodiment of the present disclosure.
Figure 3A:
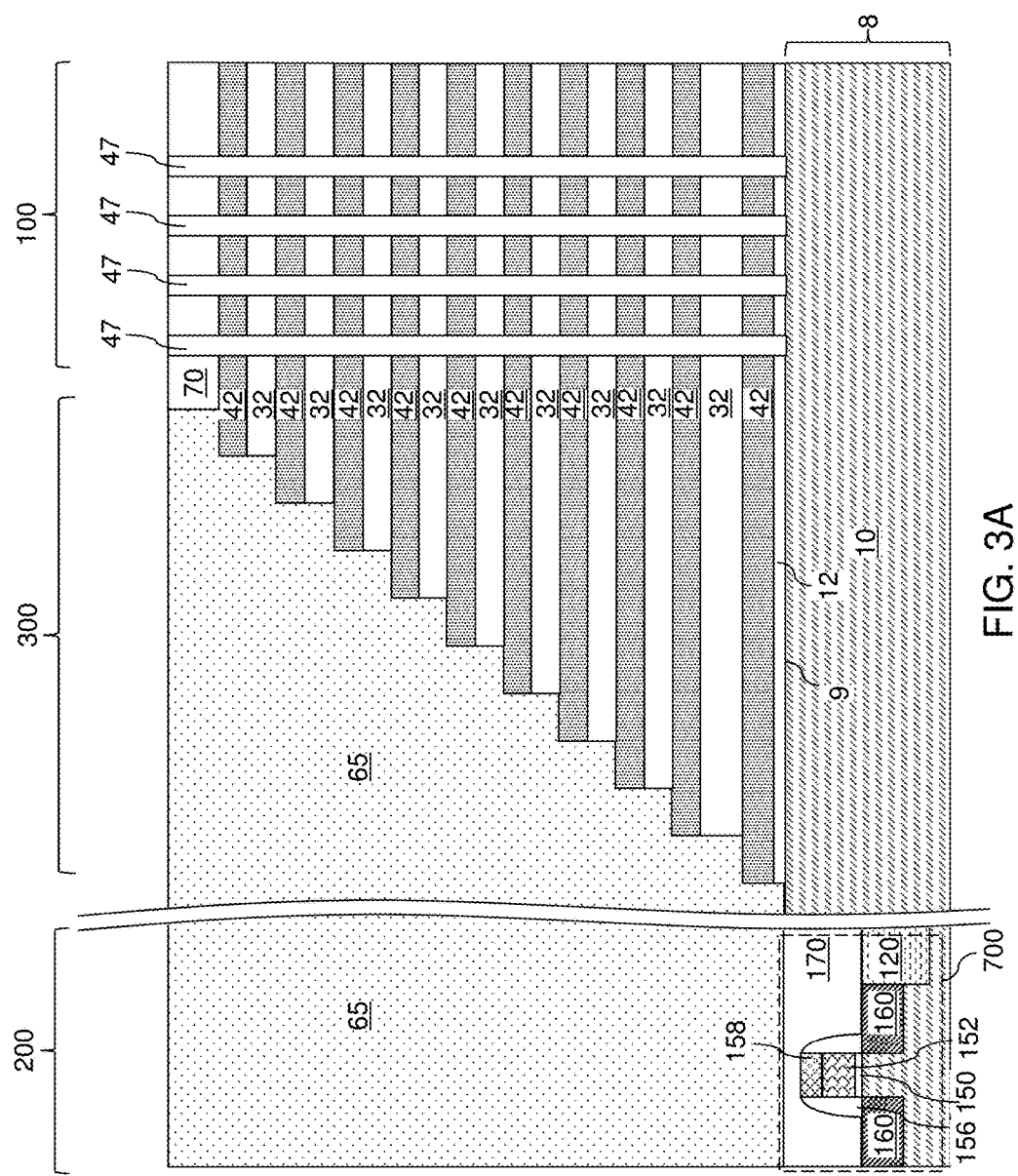
FIG. 3A is a vertical cross-sectional view of the exemplary structure after formation of separator insulator structures through the alternating stack according to an embodiment of the present disclosure.
Figure 3B:
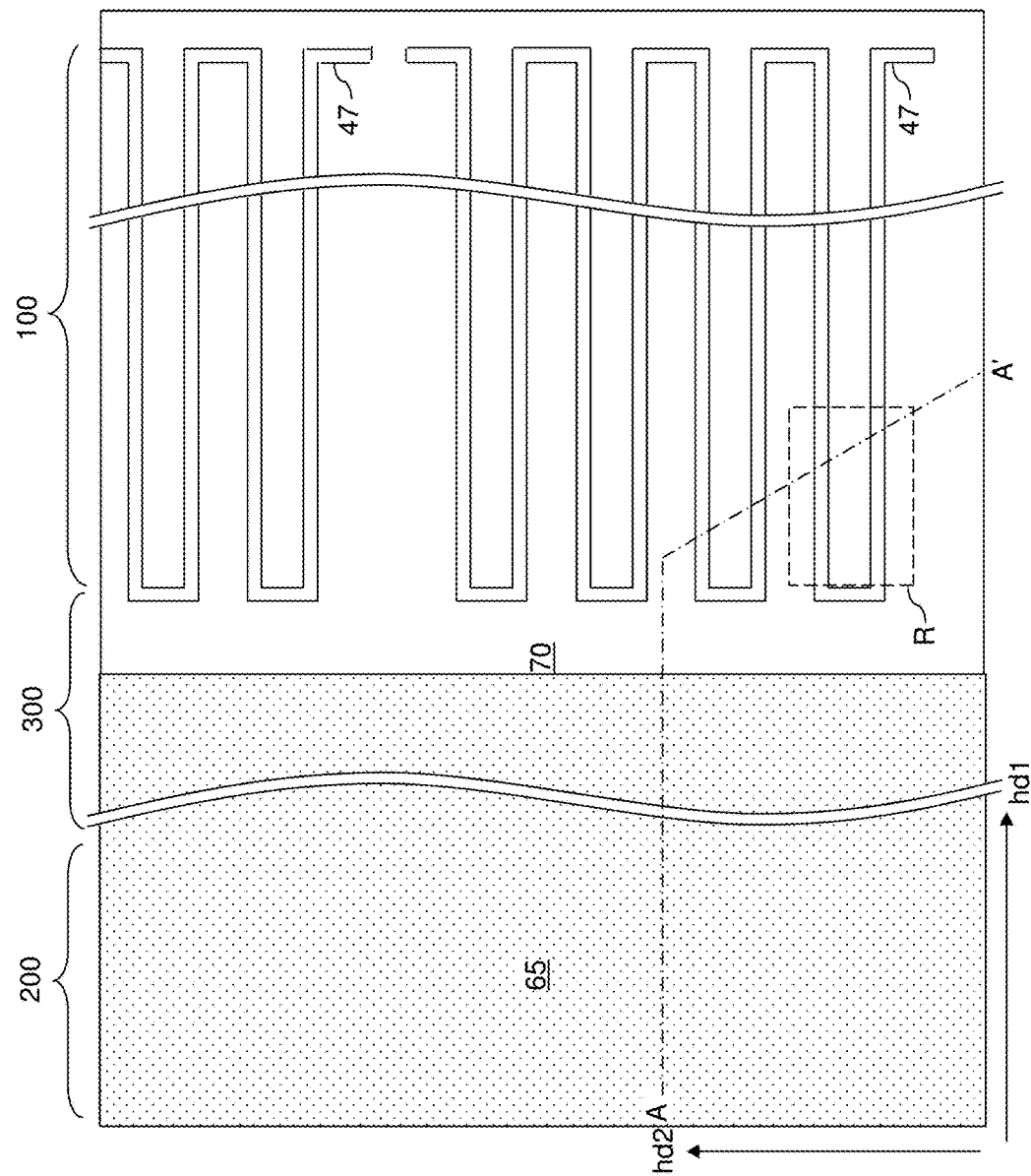
FIG. 3B is a top-down view of the exemplary structure of FIG. 3A. The vertical plane A-A' corresponds to the plane of the vertical cross-sectional view of FIG. 3A.
Figure 3C:
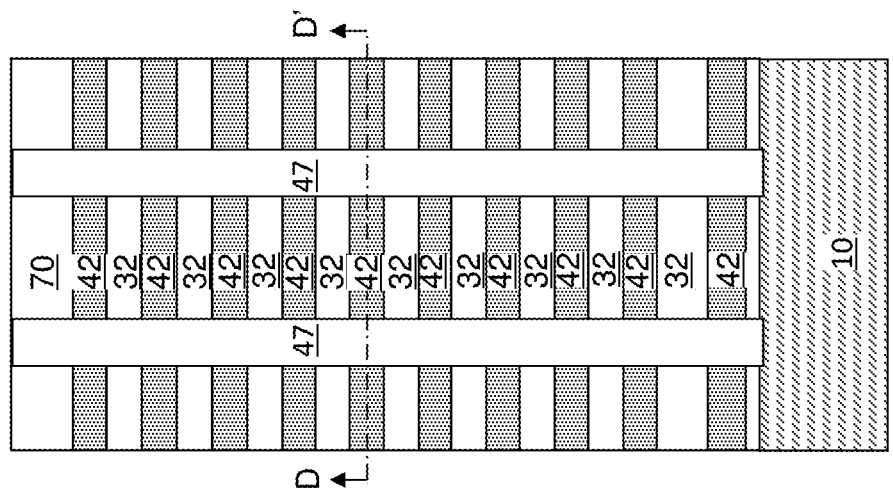
FIG. 3C is a vertical cross-sectional view of a region R of FIG. 3B along the vertical plane A-A'.
Figure 3D:
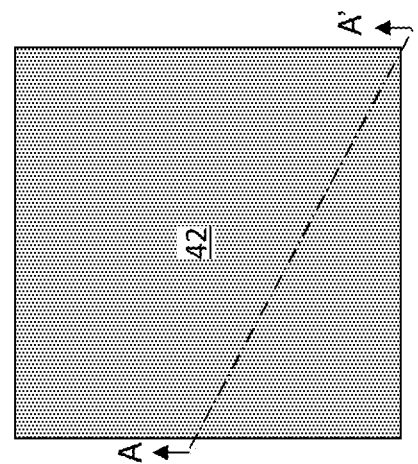
FIG. 3D is a horizontal cross-sectional view of the region R along the plane D-D' in FIG. 3C. The vertical plane A-A' corresponds to the plane of the vertical cross-sectional view of FIG. 3C.
Figure 4A:
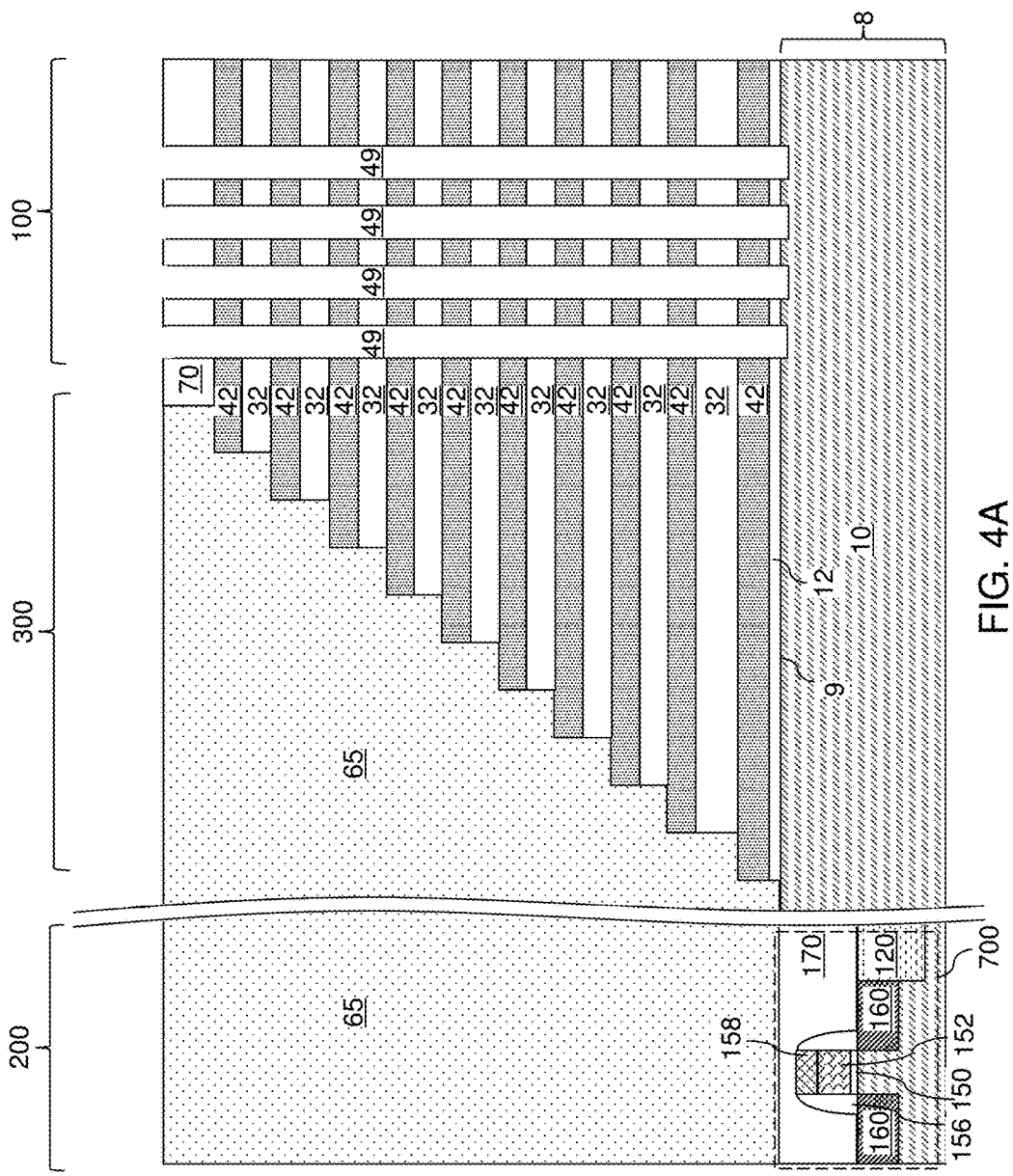
FIG. 4A is a vertical cross-sectional view of the exemplary structure after formation of openings through the separator insulator structures according to an embodiment of the present disclosure.
Figure 4B:
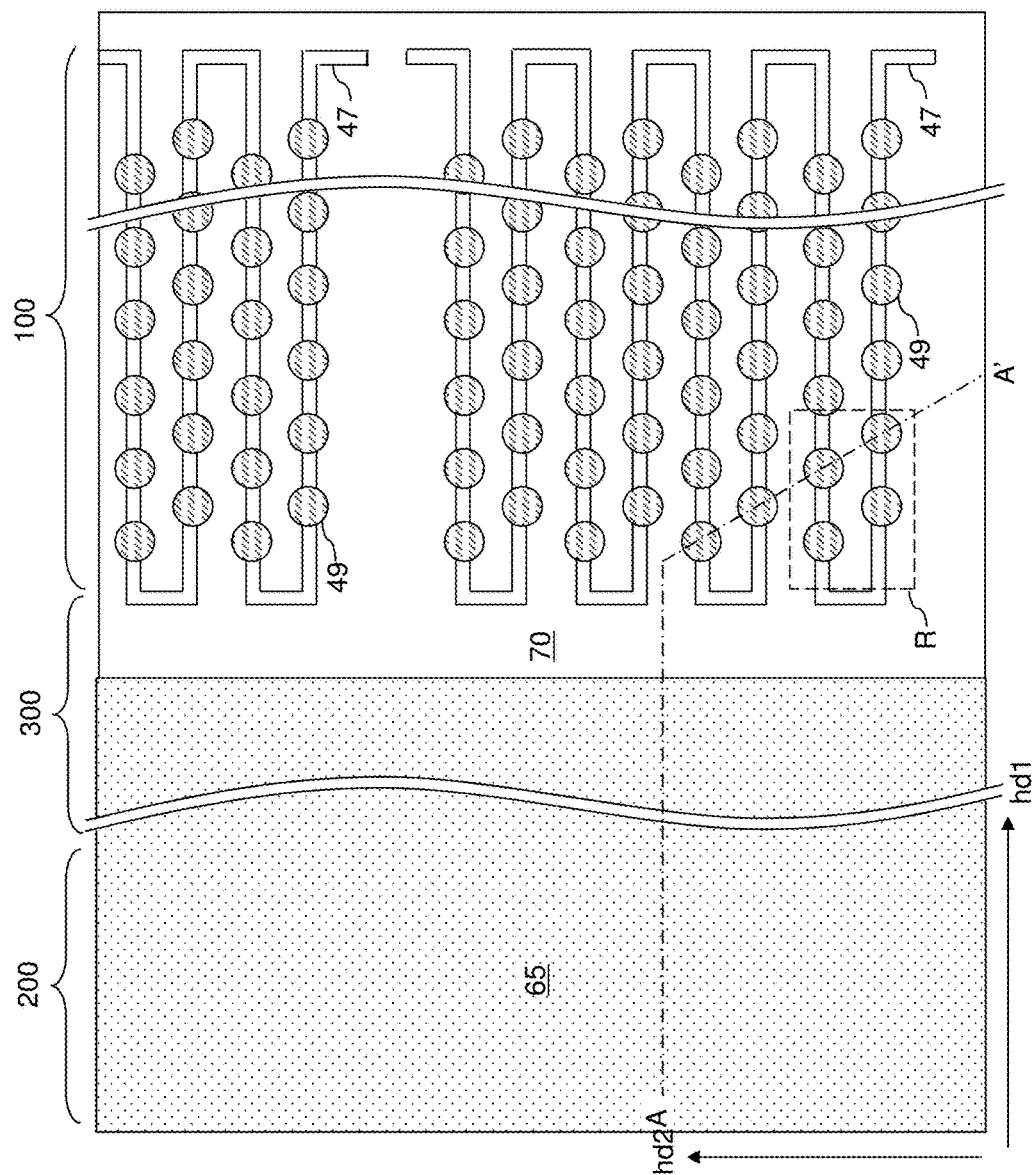
FIG. 4B is a top-down view of the exemplary structure of FIG. 4A. The vertical plane A-A' corresponds to the plane of the vertical cross-sectional view of FIG. 4A.
Figure 4C:
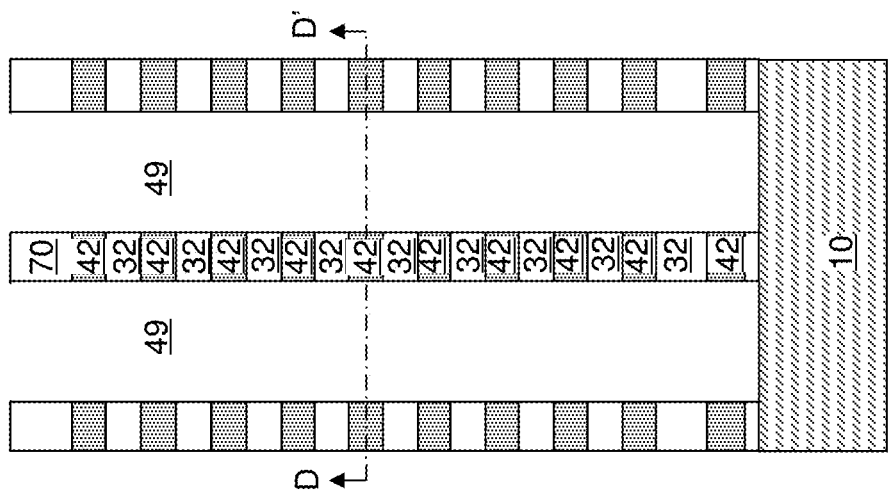
FIG. 4C is a vertical cross-sectional view of the region R of FIG. 4B along the vertical plane A-A'.
Figure 4D:
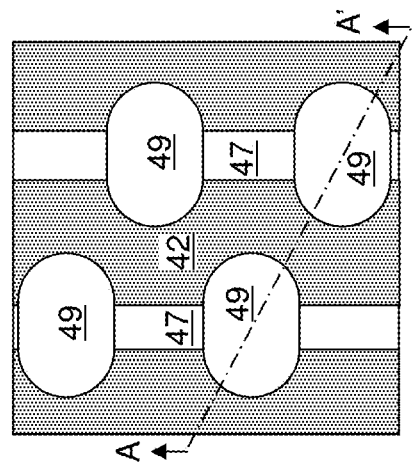
FIG. 4D is a horizontal cross-sectional view of the region R along the plane D-D' in FIG. 4C. The vertical plane A-A' corresponds to the plane of the vertical cross-sectional view of FIG. 4C.
Figure 5A:
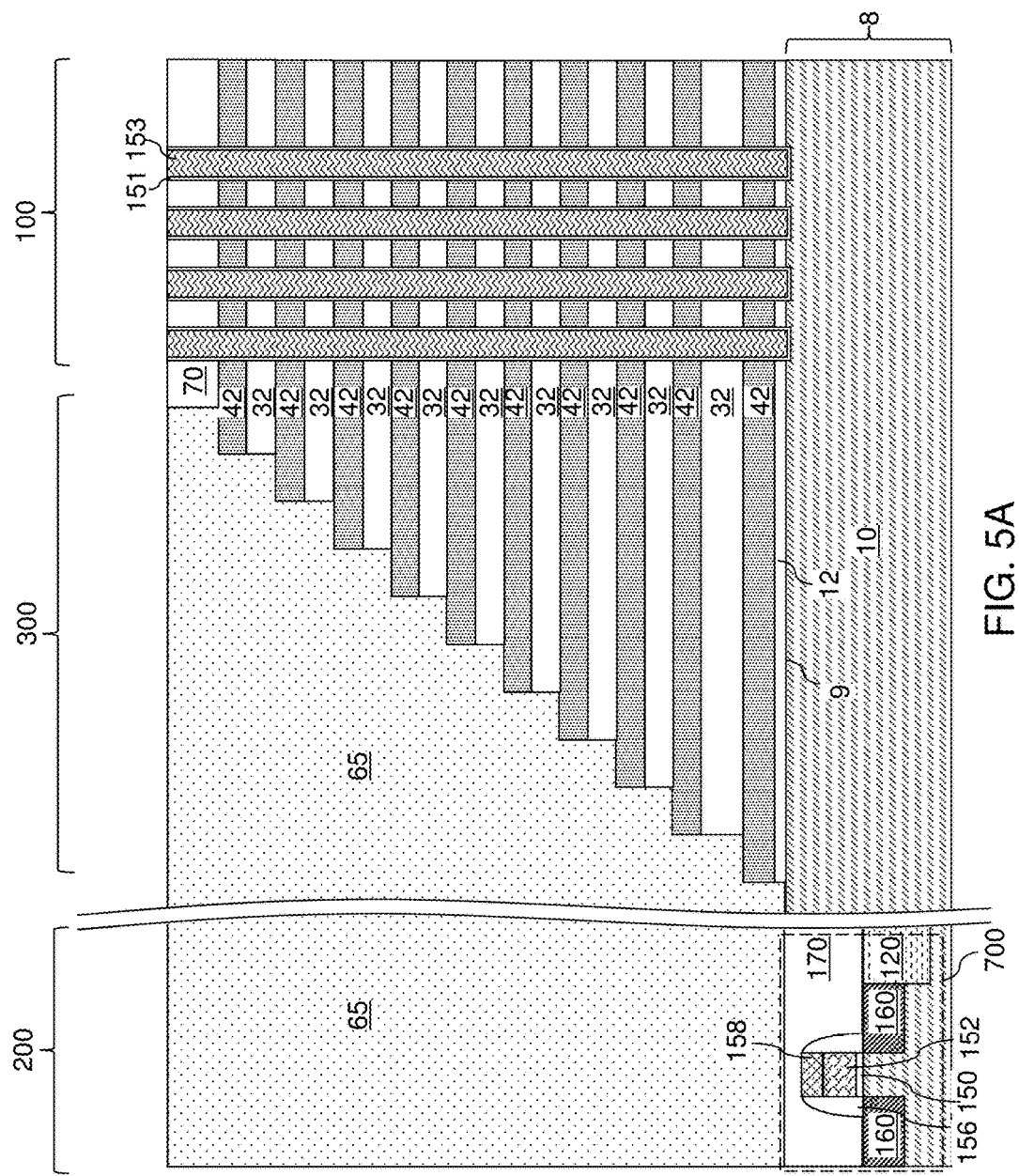
FIG. 5A is a vertical cross-sectional view of the exemplary structure after formation of sacrificial pillar structures in the openings according to an embodiment of the present disclosure.
Figure 5B:
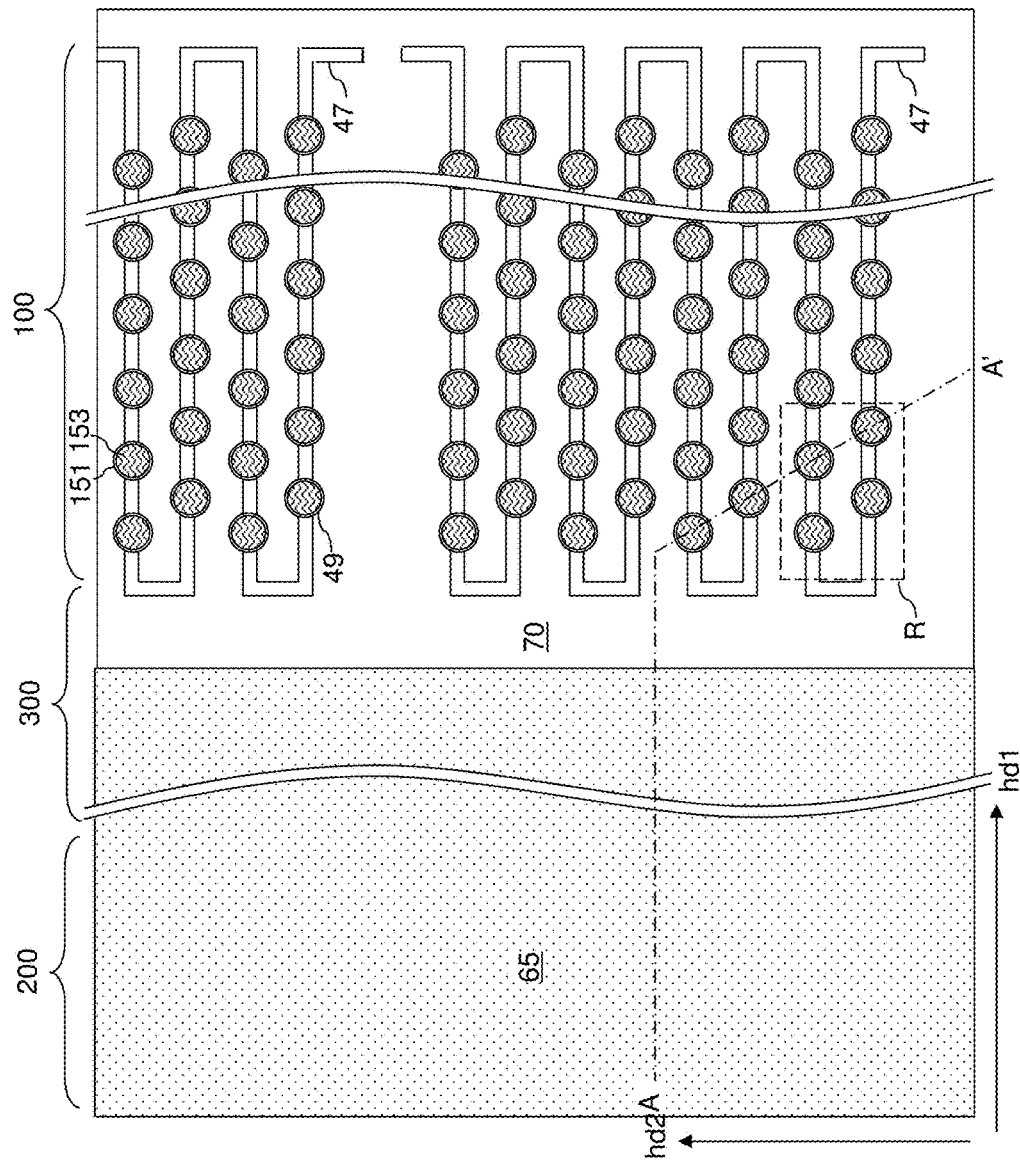
FIG. 5B is a top-down view of the exemplary structure of FIG. 5A. The vertical plane A-A' corresponds to the plane of the vertical cross-sectional view of FIG. 5A.
Figure 5C:
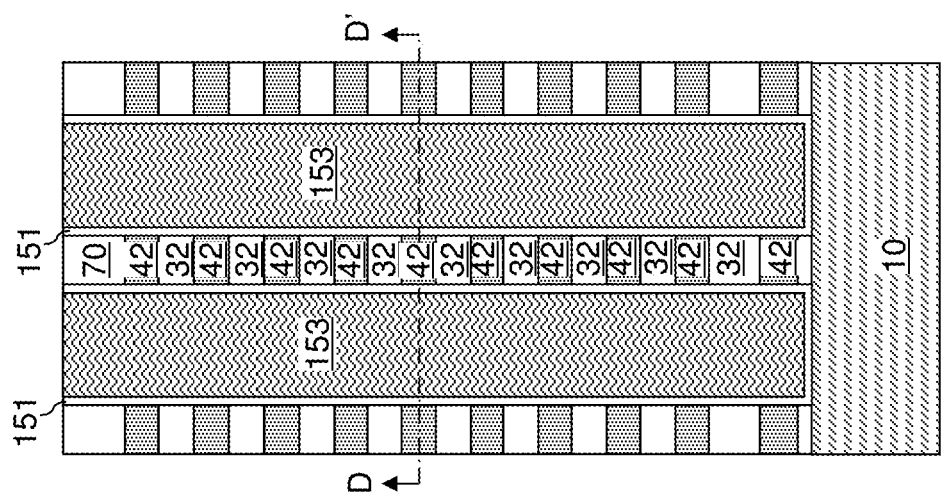
FIG. 5C is a vertical cross-sectional view of the region R of FIG. 5B along the vertical plane A-A'.
Figure 5D:
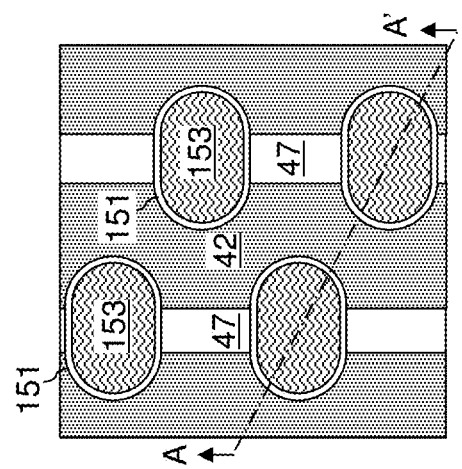
FIG. 5D is a horizontal cross-sectional view of the region R along the plane D-D' in FIG. 5C. The vertical plane A-A' corresponds to the plane of the vertical cross-sectional view of FIG. 5C.
Figure 6A:
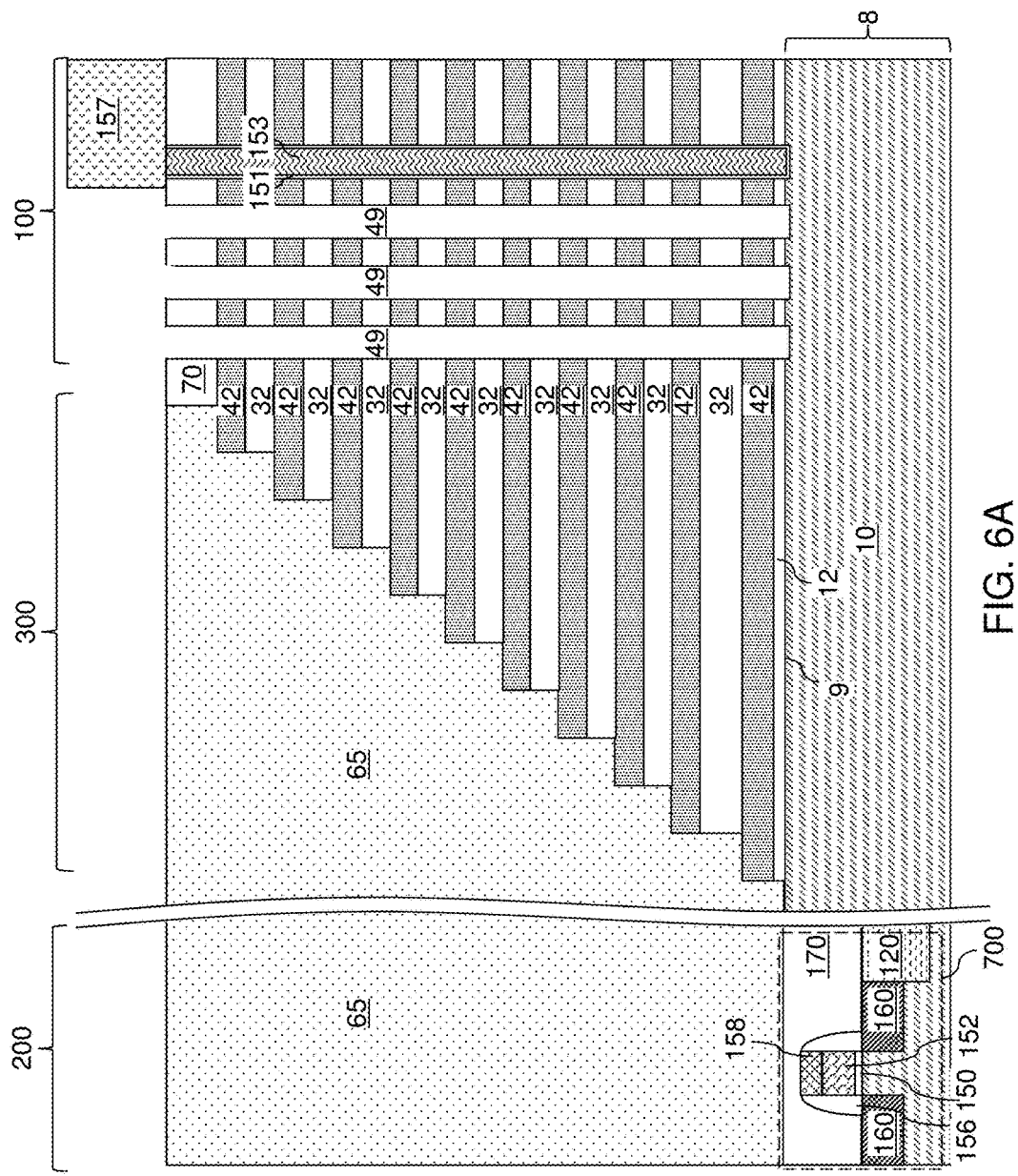
FIG. 6A is a vertical cross-sectional view of the exemplary structure after removal of a first subset of the sacrificial pillar structures from a first subset of the openings according to an embodiment of the present disclosure.
Figure 6B:
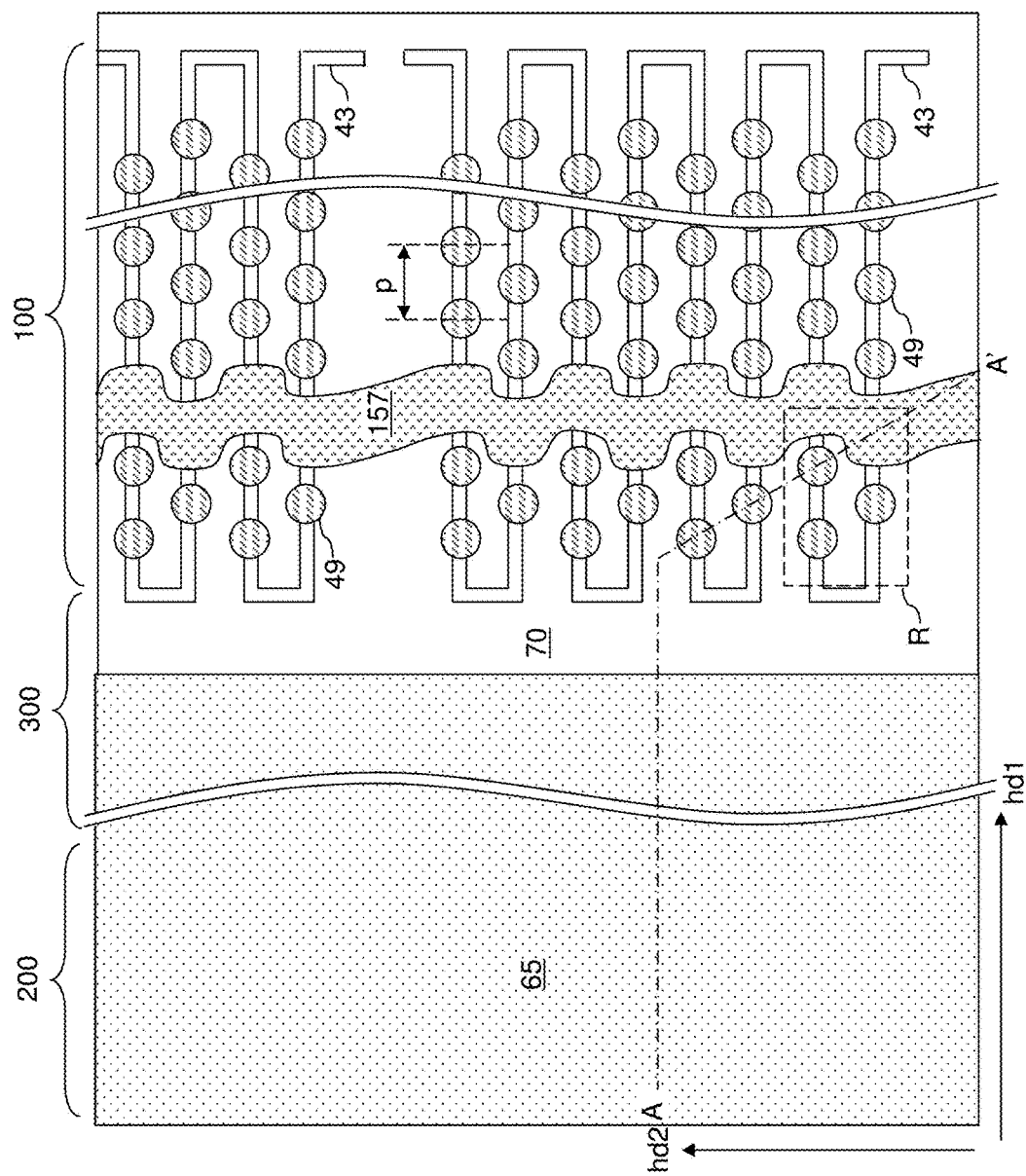
FIG. 6B is a top-down view of the exemplary structure of FIG. 6A. The vertical plane A-A' corresponds to the plane of the vertical cross-sectional view of FIG. 6A.
Figure 6C:
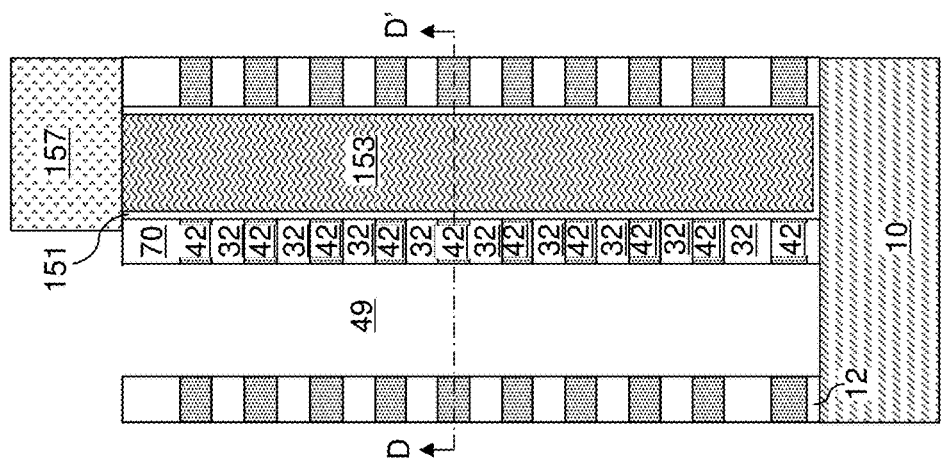
FIG. 6C is a vertical cross-sectional view of the region R of FIG. 6B along the vertical plane A-A'.
Figure 6D:
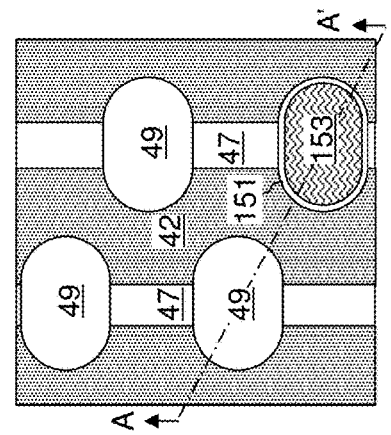
FIG. 6D is a horizontal cross-sectional view of the region R along the plane D-D' in FIG. 6C. The vertical plane A-A' corresponds to the plane of the vertical cross-sectional view of FIG. 6C.

Referring to FIG. 2, a stepped cavity can be formed within the contact region 300. As used herein, a "stepped cavity" refers to a cavity including stepped surfaces that include a continuous set of surfaces including vertical surface and horizontal surfaces that are adjoined to provide different lateral extents. In one embodiment, an upper region of the stepped cavity can have a greater lateral extent than a lower region of the stepped cavity. In one embodiment, each overlying portion of the stepped cavity can have a greater lateral extent than any underlying portion of the stepped cavity. Specifically, the alternating stack (32, 42) can be patterned to form a stepped cavity in the contact region 300. The stepped cavity includes stepped terraces, which are a set of stepped surfaces that continuously extend from the bottommost layer of the alternating stack (32, 42) to the topmost layer of the alternating stack (32, 42). Within the terrace region, each spacer material layer 42 other than a topmost spacer material layer within the alternating stack (32, 42) laterally extends farther than any overlying spacer material layers within the alternating stack (32, 42). Thus, the topmost spacer material layer 42 can have the least lateral extent along a horizontal direction, the second-from-the-top spacer material layer 42 can have a greater lateral extent along the horizontal direction, the third-from-the-top sacrificial material layer can have a greater lateral extent than the topmost spacer material layer 42 and the second-from-the-top spacer material layer 42, and so on. In one embodiment, a sidewall of the gate dielectric layer 12 and a top surface of the planarization dielectric layer 170 can be physically exposed to the stepped cavity.

In one embodiment, the horizontal cross-sectional shape of the stepped cavity changes in steps as a function of the vertical distance from the top surface of the substrate 8. In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

A retro-stepped dielectric material portion 65 can be formed in the stepped cavity by deposition of a dielectric material therein. The retro-stepped dielectric material portion 65 includes a dielectric fill material such as silicon oxide. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. The retro-stepped dielectric material portion 65 contacts the stepped surfaces of the alternating stack (32, 42).

Referring to FIGS. 3A-3D, separator trenches can be formed through the insulating cap layer 70, the alternating stack (32, 42), and optionally through the gate dielectric layer 12, for example, by application and patterning of a photoresist layer (not shown) over the alternating stack (32, 42), and transfer of the pattern in the photoresist layer through the insulating cap layer 70, the alternating stack (32, 42), and optionally through the gate dielectric layer 12 employing an anisotropic etch process. The anisotropic etch process can employ the semiconductor material layer 10 as a stopping structure. For example, the etch chemistry of the anisotropic etch process can be selected to etch through the first and second materials of the alternating stack (32, 42), and to be selective to the material of the semiconductor material layer 10. The bottom surface of each separator trench can be formed on a topmost surface or a recessed top surface of the semiconductor substrate layer 10. The photoresist layer can be subsequently removed, for example, by ashing.

Each separator trench can be filled with a dielectric material, which may be the same as, or may be different from, the material of the insulating layers 32. The dielectric material that fills the separator trenches is different from the material of the spacer material layers 42. The dielectric material that fills the separator trenches is herein referred to as a separator insulating material. For example, the separator insulating material can be undoped silicate glass or doped silicate glass. Excess portions of the separator insulating material can be removed from above the top surface of the alternating stack (32, 42), for example, by chemical mechanical planarization (CMP), a recess etch, or a combination thereof. Remaining portions of the deposited separator insulating material constitutes separator insulator structures 47, which are separator structures including an insulating material. As used herein, a separator structure refers to a structure that physically separates at least two portions of a material layer. In one embodiment, the separator insulator structures 47 can laterally separate each layer within the alternating stack (32, 42) to separate the alternating stack (32, 42) into multiple regions including interdigitated structures in which fingers of each material layer within the alternating stack (32, 42) extend along a first horizontal direction hd1 and neighboring fingers are laterally spaced from one another along a second horizontal direction hd2 that is perpendicular to the first horizontal direction hd1. The separator insulator structures 47 extend through the alternating stack.

At least one dielectric pillar structure (not shown) can be formed through the entire set of the spacer material layers 42 and the insulating layers 32, for example, by formation of openings therethrough and filling of the openings with a dielectric material.

Referring to FIGS. 4A-4D, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through the alternating stack (32, 42) by at least one anisotropic etch that employs the patterned lithographic material stack as an etch mask. Portions of the alternating stack (32, 42) underlying the openings in the patterned lithographic material stack are etched to form through-stack openings 49. In other words, the transfer of the pattern in the patterned lithographic material stack through the alternating stack (32, 42) forms the through-stack openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the through-stack openings 49 can be substantially vertical, or can be tapered. The patterned lithographic material stack can be subsequently removed, for example, by ashing.

In one embodiment, the through-stack openings 49 can be formed through the separator insulator structures 47. In case the separator insulator structures 47 include portions that extend horizontally along the first horizontal direction hd1, the through-stack openings 49 can include rows of through-stack openings 49 that are arranged along the first horizontal direction hd1. In other words, each row of through-stack openings 49 can extend along the first horizontal direction hd1 such that the through-stack opening 49 in each row divide a respective intersecting portion of a separator insulator structure 47 into multiple separator insulator structures 47. Each row of through-stack openings 49 can be laterally spaced from one another along the second horizontal direction hd2. In one embodiment, each through-stack opening 49 can be formed through a portion of a respective separator insulator structure 47. Each of the separator insulator structures 47 can be divided into multiple segments upon formation of the through-stack openings 49.

In one embodiment, the lateral direction of each through-stack opening 49 along the second horizontal direction hd2 can be greater than the width of the respective portion of the separator insulator structures 47 (which are intersected by the through-stack openings) along the second horizontal direction hd2. This configuration enables exposure of two different fingers of each material layer within the alternating stack (32, 42) around each through-stack opening 49.

The through-stack openings 49 are formed through the gate dielectric layer 12 so that the through-stack openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each through-stack opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each through-stack opening 49 can be coplanar with the topmost surface of the semiconductor material layer 10. Each of the through-stack openings 49 can include a sidewall (or a plurality of sidewalls) that extends substantially perpendicular to the topmost surface of the substrate. The array of through-stack openings 49 is formed in the memory array region 100.

In one embodiment, each through-stack opening 49 can have a same horizontal cross-sectional shape and a same vertical height. In this case, each through-stack opening 49 can have a same volume and a same shape. In one embodiment, an array of through-stack openings 49 can be formed as a two-dimensional periodic array including rows of through-stack openings 49. In one embodiment, the array of through-stack openings 49 can be formed through the separator insulator structures 47 and divides each of the separator insulator structures 47 into multiple disjoined separator insulator structures 47 spaced from one another by a respective subset of the through-stack openings 49.

Referring to FIGS. 5A-5D, an optional sacrificial liner 151 may be formed on the surfaces of the through-stack openings 49 and over the insulating cap layer 70. The optional sacrificial liner 151 includes an etch stop material that can function as a stopping structure during removal of sacrificial pillar structures to be subsequently formed in remaining volumes of the through-stack openings 49. In one embodiment, the optional sacrificial liner 151 can include a dielectric material such as silicon oxide, silicon nitride, or a dielectric metal oxide. The optional sacrificial liner 151 can be deposited by a conformal deposition process such as chemical vapor deposition or atomic layer deposition. The thickness of the optional sacrificial liner 151 can be in a range from 1 nm to 6 nm, although lesser and greater thicknesses can also be employed. In an illustrative example, the optional sacrificial liner 151 can include silicon oxide having a thickness of about 2 nm.

A sacrificial fill material is deposited in remaining volumes of the through-stack openings 49 to completely fill the through-stack openings 49. Excess portions of the sacrificial fill material is removed from above a horizontal plane including the top surface of the insulating cap layer 70 by a planarization process, which can employ a recess etch and/or chemical mechanical planarization (CMP). A horizontal portion of the optional sacrificial liner 151 located above the horizontal plane including the top surface of the insulating cap layer 70 can be subsequently removed by an etch process, which may be an isotropic etch process or an anisotropic etch process. Each remaining portion of the sacrificial fill material in the through-stack openings 49 constitutes a sacrificial pillar structure 153.

In case the sacrificial liner 151 is employed, the sacrificial pillar structures 153 includes a material that can be removed selective to the material of the sacrificial liner 151. For example, the sacrificial liner 151 can include silicon oxide or silicon nitride, and the sacrificial pillar structures 153 can include a semiconductor material such as silicon or a silicon-germanium alloy, or a dielectric material such as a porous or non-porous organosilicate glass or carbon. In case a sacrificial liner 151 is not employed, the sacrificial pillar structures 153 includes a material that can be removed selective to the materials of the alternating stack (32, 42) and the semiconductor material layer 10. For example, the sacrificial pillar structures 153 can include a semiconductor material such as polysilicon, amorphous silicon or a dielectric material such as a porous or non-porous organosilicate glass. Each sacrificial pillar structure 153 extends through the alternating stack (32, 42), and can have a cylindrical shape.

Referring to FIGS. 6A-6D, a photoresist layer 157 can be applied over the insulating cap layer 70, and can be lithographically patterned to cover a subset of sacrificial pillar structures 153 and not to cover a complementary subset of the sacrificial pillar structures 153. The subset of the sacrificial pillar structures 153 that are not covered by the patterned photoresist layer 157 is herein referred to as a first subset of sacrificial pillar structures 153. The subset of the sacrificial pillar structures 153 that are covered by the patterned photoresist layer is herein referred to as a second subset of sacrificial pillar structures 153. The subset of all through-stack openings 49 outside the area of the photoresist layer 157 (i.e., including any sacrificial pillar structure 153 within the first subset of sacrificial pillar structures 153) is herein referred to as a first subset of through-stack openings 49. Each through-stack opening 49 within the first subset of through-stack openings 49 is a memory opening in which a memory stack structure is subsequently formed. The subset of all through-stack openings 49 covered by the photoresist layer 157 (i.e., including the sacrificial pillar structures 153 within the second subset) is herein referred to as a second subset of through-stack openings 49. Each through-stack opening 49 within the second subset of through-stack openings is an opening that is subsequently employed to provide access to etchants to enable removal of the sacrificial material layers 42, and is herein referred to as an access opening.

The second subset of sacrificial pillar structures 153 can be selected such that each sacrificial pillar structure 153 within the first subset of sacrificial pillar structures 153 (that are not covered by the patterned photoresist layer 157) is located within a predefined maximum distance from a nearest sacrificial pillar structure 153 within the second subset. For example, if the through-stack openings 49 are arranged in rows extending along the first horizontal direction hd1 with a pitch p, the maximum distance between a vertical center axis of any sacrificial pillar structure 153 within the first subset and a nearest sacrificial pillar structure 153 in the second subset (which is under the patterned photoresist layer 157) can be less than 20 times the pitch p, and may be less than 10 times the pitch p. In one embodiment, the number of the sacrificial pillar structures 153 in the second subset can be less than 25%, such as less than 15% of the total number of sacrificial pillar structures 153.

The first subset of sacrificial pillar structures 153 is removed selective to the sacrificial liners 151 (or selective to the materials of the alternating stack (32, 42) and the semiconductor material layer 10 in case the sacrificial liners 151 are not employed) by an etch process, which can be an isotropic etch process or an anisotropic etch process. In an illustrative example, if the sacrificial pillar structures 153 include a semiconductor material such as silicon and if the sacrificial liners 151 include silicon oxide, the first subset of the sacrificial pillar structures 153 can be removed selective to the sacrificial liners 151. For example, if the sacrificial pillar structures 153 include a semiconductor material, the first subset of the sacrificial pillar structures 153 can be removed by a wet etch process employing a KOH solution or a mixture of nitric acid and ammonium fluoride, or by a dry etch process employing HCl. Subsequently, the sacrificial liners 151 can be removed. Removal of the sacrificial liners 151 can be effected, for example, by a wet etch process employing dilute hydrofluoric acid (if the sacrificial liners 151 include silicon oxide), or by a wet etch process employing phosphoric acid or a mixture of dilute hydrofluoric acid and ammonium fluoride (if the sacrificial liners 151 includes silicon nitride).

Sidewalls of the through-stack openings 49 and portions of the top surface of the semiconductor material layer 10 can be physically exposed by removal of the first subset of the sacrificial pillar structures 153 and the sacrificial liners 151 within the first subset of the through-stack openings 49. The patterned photoresist layer 157 can be subsequently removed, for example, by ashing. Thus, the first subset of the sacrificial pillar structures 153 is removed from the first subset of through-stack openings 49, while the second subset of the sacrificial pillar structures 153 remains in the second subset of through-stack openings 49.

Figure 7A:
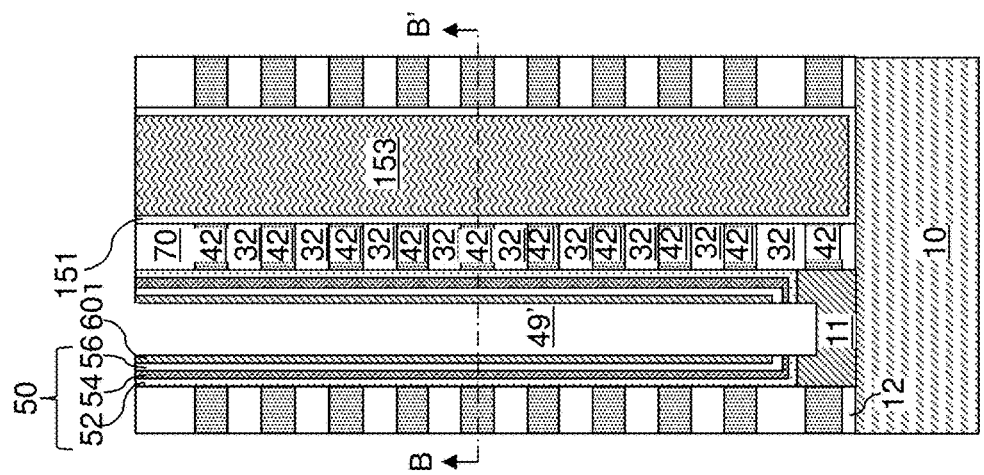
FIG. 7A is a vertical cross-sectional view of the region R of the exemplary structure after formation of a memory film and a first semiconductor channel layer in each of the first subset of openings according to an embodiment of the present disclosure.
Figure 7B:
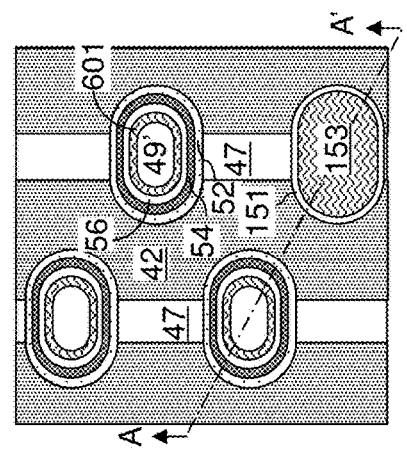
FIG. 7B is a horizontal cross-sectional view of the exemplary structure along the plane B-B' in FIG. 7A. The vertical plane A-A' corresponds to the plane of the vertical cross-sectional view of FIG. 7A.

Referring to FIGS. 7A and 7B, an optional epitaxial channel portion 11 (e.g., an epitaxial pedestal) can be formed at the bottom portion of each through-stack opening 49 within the first subset of through-stack openings 49, for example, by selective epitaxy. Each epitaxial channel portion 11 can include a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed at a level of an insulating layer 32. In case the second subset of sacrificial pillar structures 153 (which is the only remaining set of sacrificial pillar structures 153 at this processing step) includes a semiconductor material, a polycrystalline semiconductor material portion (not shown) can be formed on a top surface of each sacrificial pillar structure 153 the second subset of sacrificial pillar structures 153. Such polycrystalline semiconductor material portions are removed in a planarization process to be subsequently performed.

The epitaxial channel portion 11 can be a portion of a transistor channel that extends between a source region to be subsequently formed in the substrate 8 and a drain region to be subsequently formed in an upper portion of each through-stack opening 49 within the first subset of through-stack openings 49. A cavity 49' is present in the unfilled portion of the through-stack opening 49 within the first subset of through-stack openings 49 above a respective epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts.

A stack of layers including a blocking dielectric layer 52, a memory material layer 54, a tunneling dielectric layer 56, and an optional first semiconductor channel layer 601 can be sequentially deposited in the through-stack openings 49 within the first subset of through-stack openings 49. In one embodiment, the blocking dielectric layer 52 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The blocking dielectric layer 52 can be deposited, for example, by chemical vapor deposition (CVD), atomic layer deposition (ALD), pulsed laser deposition (PLD), liquid source misted chemical deposition, or a combination thereof. In one embodiment, the blocking dielectric layer 52 includes aluminum oxide.

Alternatively or additionally, the blocking dielectric layer 52 can include a dielectric material that is different from the dielectric material of the blocking dielectric layer 52. For example, the blocking dielectric layer 52 can include silicon oxide, silicon oxynitride, silicon nitride, or a combination thereof. In one embodiment, the blocking dielectric layer 52 can include a stack including an aluminum oxide layer and a silicon oxide layer. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed. The blocking dielectric layer 52 can subsequently function as a dielectric material portion that blocks leakage of stored electrical charges to control gate electrodes. Alternatively, the blocking dielectric layer 52 can be omitted, and a blocking dielectric layer can be formed after formation of lateral recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into spacer material layers 42. In one embodiment, the memory material layer 54 includes a silicon nitride layer. In one embodiment, the spacer material layers 42 and the insulator layers 32 can have vertically coincident sidewalls, and the memory material layer 54 can be formed as a single continuous layer.

In another embodiment, the spacer material layers 42 can be laterally recessed with respect to the sidewalls of the insulator layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

The memory material layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each through-stack opening 49 within the first subset of through-stack openings 49 that is not filled with the deposited material layers (52, 54, 56, 601).

The optional first semiconductor channel layer 601, the tunneling dielectric layer 56L, the memory material layer 54, the blocking dielectric layer 52 are sequentially anisotropically etched employing at least one anisotropic etch process. The portions of the first semiconductor channel layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the memory material layer 54, and the blocking dielectric layer 52 at a bottom of each cavity 49' can be removed to form openings in remaining portions thereof. Each of the first semiconductor channel layer 601, the tunneling dielectric layer 56, the memory material layer 54, and the blocking dielectric layer 52 can be etched by anisotropic etch process.

The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a charge storage layer in which each portion adjacent to the spacer material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the memory material layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the memory material layer 54. A set of blocking dielectric layer 52, a memory material layer 54, and a tunneling dielectric layer 56 in each through-stack opening 49 (within the first subset of through-stack openings 49) constitutes a memory film 50, which includes a plurality of charge storage regions (as embodied as the memory material layer 54) that are insulated from surrounding materials by the blocking dielectric layer 52 and the tunneling dielectric layer 56. In one embodiment, the first semiconductor channel layer 601, the tunneling dielectric layer 56, the memory material layer 54, the blocking dielectric layer 52, and the blocking dielectric layer 52 can have vertically coincident sidewalls.

Referring to FIGS. 8A and 8B, a second semiconductor channel layer 602 can be deposited directly on the semiconductor surface of the epitaxial channel portion 11 (or on the semiconductor substrate layer 10 if epitaxial channel portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each through-stack opening 49 within the first subset of through-stack openings 49, or may fully fill the cavity 49' in each through-stack opening 49 within the first subset of through-stack openings 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity 49' in each through-stack opening 49 in the first subset of through-stack openings 49 is not completely filled by the second semiconductor channel layer 602, a dielectric core layer can be deposited in the cavity 49' to fill any remaining portion of the cavity 49' within each through-stack opening 49 within the first subset of through-stack openings 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the insulating cap layer 70. Each remaining portion of the dielectric core layer constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of lateral recesses. As used herein, a macroscopic retention time refers to a retention time suitable for operation of a memory device as a permanent memory device such as a retention time in excess of 24 hours.

The top surface of each dielectric core 62 can be further recessed within each through-stack opening 49 within the first subset of through-stack openings 49, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each adjoining set of a vertical semiconductor channel 60 and a memory film 50 constitutes a memory stack structure 55, which includes a vertical stack of memory elements that can be embodied as portions of the memory material layer 54 located at the levels of the spacer material layers 42. An epitaxial channel portion 11 can be provided at a bottom of each through-stack opening 49 within the first subset of through-stack openings 49. Each memory stack structure 55 can be provided over a respective epitaxial channel portion 11.

Figure 9A:
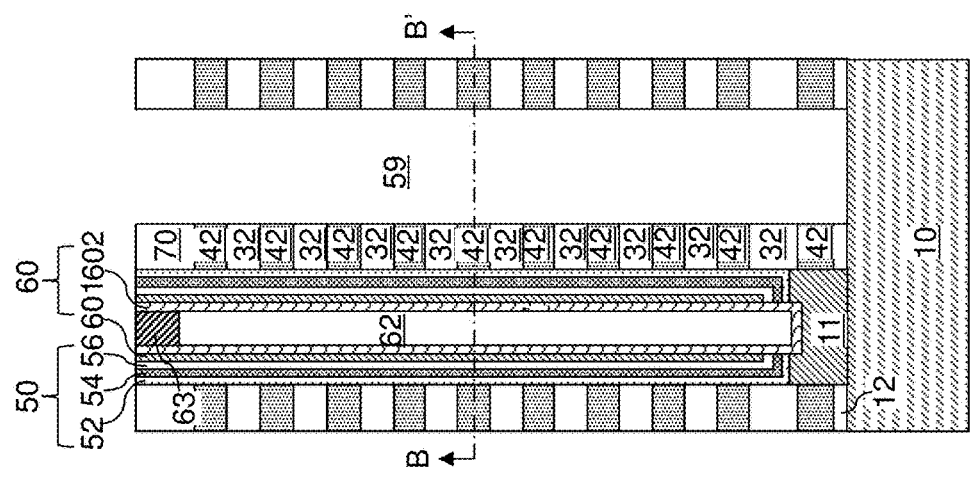
FIG. 9A is a vertical cross-sectional view of the region R of the exemplary structure after removal of the sacrificial pillar structures from a second subset of openings according to an embodiment of the present disclosure.
Figure 9B:
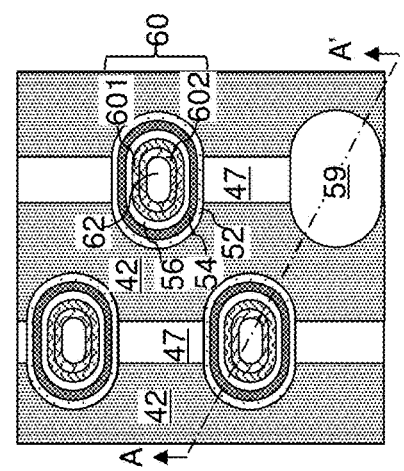
FIG. 9B is a horizontal cross-sectional view of the exemplary structure along the plane B-B' in FIG. 9A. The vertical plane A-A' corresponds to the plane of the vertical cross-sectional view of FIG. 9A.

Referring to FIGS. 9A and 9B, another photoresist layer (not shown) may be applied over the insulating cap layer 70 to cover all memory stack structures 55, while physically exposing the second subset of sacrificial pillar structures 153. The second subset of sacrificial pillar structures 153 can be removed selective to the sacrificial liners 151.

The second subset of sacrificial pillar structures 153 is removed selective to the sacrificial liners 151 (or selective to the materials of the alternating stack (32, 42) and the semiconductor material layer 10 in case the sacrificial liners 151 are not employed) by an etch process, which can be an isotropic etch process or an anisotropic etch process. The same etch process can be employed to remove the second subset of sacrificial pillar structures 153 as the etch process previously employed to remove the first subset of sacrificial pillar structures 153 at the processing steps of FIGS. 6A-6D. Subsequently, the sacrificial liners 151 can be removed. The same etch process can be employed as the etch process employed to remove the sacrificial liners 151 at the processing steps of FIGS. 6A-6D. The photoresist layer can be subsequently removed, for example, by ashing.

The sacrificial pillar structures 153 and the sacrificial liners 151 are removed from within the second subset of through-stack openings 49. Each through-stack opening 49 within the second subset of through-stack openings 49 can be entirely occupied by a cavity, and is herein referred to as an access opening 59. Each access opening 59 can have the same volume as a respective through-stack opening 49 within the second subset of through-stack openings 49. Thus, the access openings 59 can have the same volume as the second set of through-stack openings 49, and is interspersed with the memory stack structures 55 that fill volumes of the first subset of through-stack openings 49.

In the embodiment of FIGS. 4A-4D, forming the first subset of openings and forming the second subset of openings occurs at the same time during the same etching step. The second subset of openings are filled with the sacrificial pillar structures 153 while the memory stack structures 55 are formed in the first subset of openings, as shown in FIGS. 5A-9B.

In an alternative embodiment, forming the first subset of openings and forming the second subset of openings occurs during different etching steps, such that forming the second subset of openings occurs after forming the first subset of openings. In this alternative embodiment, only the memory openings 49 are formed during the etching step shown in FIGS. 4A-4D. The formation and removal of the sacrificial liners 151 and the sacrificial pillar structures 153 of FIGS. 5A-6D and 9A-9B is omitted. The memory stack structures 55 are formed in the memory openings 49 as shown in FIGS. 7A-8B. Then, after formation of the memory stack structures 55, the access openings 59 are formed in the array of openings using a separate photolithography (e.g., resist formation and patterning) and etching step to arrive at the structure shown in FIGS. 9A-9B.

Referring to FIGS. 10A and 10B, an etchant that selectively etches the second material of the spacer material layers 42 with respect to the first material of the insulating layers 32 can be introduced into the access openings 59, for example, employing an etch process. Lateral recesses 43 are formed in volumes from which the spacer material layers 42 are removed. The removal of the second material of the spacer material layers 42 can be selective to the first material of the insulating layers 32, the material of the at least one dielectric pillar structure, the material of the retro-stepped dielectric material portion 65, the material of the gate dielectric layer 12, and the material of the outermost layer of the memory films 50. In one embodiment, the spacer material layers 42 can include a material selected from silicon nitride, germanium, and a silicon-germanium alloy including germanium at an atomic concentration greater than 40%, and the materials of the insulating layers 32, the at least one dielectric pillar structure, the retro-stepped dielectric material portion 65, and the gate dielectric layer 12 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the access openings 59. For example, if the spacer material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric pillar structure, the retro-stepped dielectric material portion 65, and the memory stack structures 55 provide structural support while the lateral recesses 43 are present within volumes previously occupied by the spacer material layers 42.

Thus, removal of the second subset of the sacrificial pillar structures 153 forms the access openings 59 (which are the second subset of through-stack openings 49). The sacrificial material layers 42 are removed by introducing an etchant through the access openings 59 (which are the second subset of through-stack openings 49) while the first subset of through-stack openings 49 is filled with the memory stack structures 55. Removal of the sacrificial material layers 42 forms the lateral recesses 43.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the spacer material layers 42 is removed. The memory openings in which the memory stack structures 55 are formed are herein referred to as front side openings or front side cavities in contrast with the lateral recesses 43. In one embodiment, the memory array region 100 comprises an array of monolithic three-dimensional NAND strings having a plurality of device levels disposed above the substrate 8. In this case, each lateral recess 43 can define a space for receiving a respective word line of the array of monolithic three-dimensional NAND strings.

Each of the plurality of lateral recesses 43 can extend substantially parallel to the top surface of the substrate 8. A lateral recess 43 can be vertically bounded by a top surface of an underlying insulating layer 32 and a bottom surface of an overlying insulating layer 32. In one embodiment, each lateral recess 43 can have a uniform height throughout. Alternatively, the lateral recesses 43 may have height variations.

Physically exposed surface portions of the optional epitaxial channel portions 11 can be converted into dielectric material portions by thermal conversion and/or plasma conversion (such as oxidation or nitridation) into dielectric materials. For example, thermal conversion and/or plasma conversion can be employed to convert a surface portion of each epitaxial channel portion 11 into a tubular dielectric spacer 116. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dialectric spacers 116 can include a dielectric oxide, a dielectric nitride, or a dielectric oxynitride of the semiconductor material of the epitaxial channel portions 11. A dielectric semiconductor compound region 616 can be formed on the physically exposed surfaces of the access openings 59 concurrently with formation of the tubular dielectric spacers 116 by oxidation or nitridation of surface portions of the semiconductor material layer 10.

Optionally, a backside blocking dielectric layer (not shown) can be formed in the lateral recesses 43. The backside blocking dielectric layer, if present, comprises a dielectric material that functions as a portion of a control gate dielectric for the control gates to be subsequently formed in the lateral recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

Figure 11A:
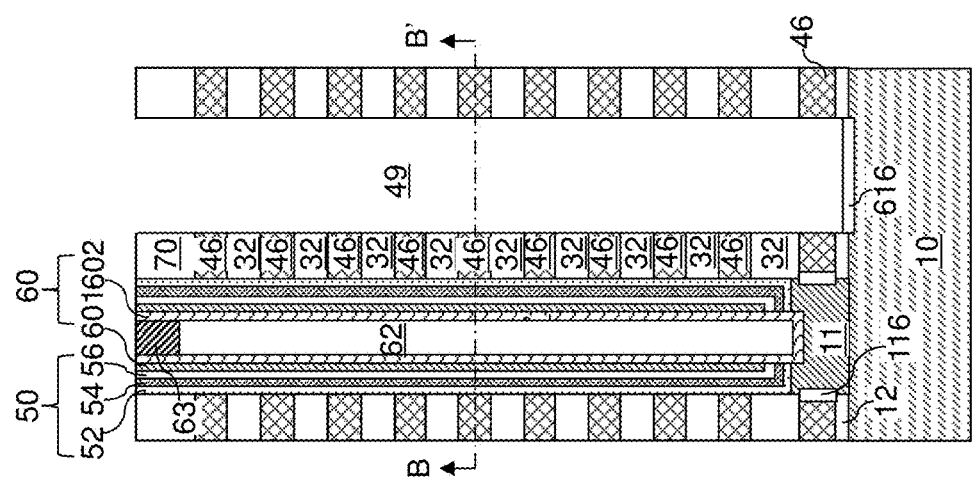
FIG. 11A is a vertical cross-sectional view of the region R of the exemplary structure after formation of electrically conductive layers in the lateral recesses according to an embodiment of the present disclosure.
Figure 11B:
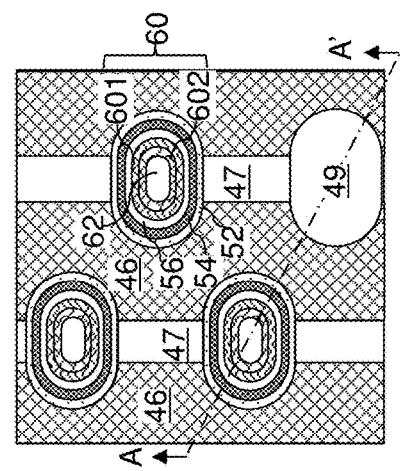
FIG. 11B is a horizontal cross-sectional view of the exemplary structure along the plane B-B' in FIG. 11A. The vertical plane A-A' corresponds to the plane of the vertical cross-sectional view of FIG. 11A.

Referring to FIGS. 11A and 11B, at least one metallic material can be deposited in the plurality of lateral recesses 43, on the sidewalls of the access openings 59, and over the top surface of the insulating cap layer 70. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of lateral recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of lateral recesses 43 can be a combination of titanium nitride layer and a tungsten fill material. In one embodiment, the metallic material can be deposited by chemical vapor deposition.

A plurality of electrically conductive layers 46 can be formed in the plurality of lateral recesses 43, and a continuous metallic material layer can be formed on the sidewalls of each access opening 59 and over the insulating cap layer 70. Thus, each spacer material layer 42 can be replaced with an electrically conductive layer 46. A backside cavity is present in the portion of each access opening 59 that is not filled with the backside blocking dielectric layer and the continuous metallic material layer.

The deposited metallic material of the continuous electrically conductive material layer is etched back from the sidewalls of each access opening 59 and from above the insulating cap layer 70, for example, by an isotropic wet etch, an anisotropic dry etch, or a combination thereof. Each remaining portion of the deposited metallic material in the lateral recesses 43 constitutes an electrically conductive layer 46. Each electrically conductive layer 46 can be a conductive line structure. Thus, the spacer material layers 42 are replaced with the electrically conductive layers 46. The alternating stack (32, 42) of insulating layers 32 and sacrificial material layers 42 is replaced with an alternating stack (32, 46) of insulating layers 32 and electrically conductive layers 46.

A first subset of the electrically conductive layers 46 located at a respective source select gate level can function as at least one source-side select gate electrode. A second subset of the electrically conductive layers 46 located at word line levels can function as a combination of a plurality of control gate electrodes located at a same level and a word line electrically interconnecting, i.e., electrically shorting, the plurality of control gate electrodes located at the same level. A third subset of the electrically conductive layers 46 located at a respective drain select gate level can function as at least one drain-side select gate electrode. The plurality of control gate electrodes within the second subset of the electrically conductive layer 46 can be the control gate electrodes for the vertical memory devices including the memory stack structures 55. In other words, each conductive layer 46 located at a respective word line level can function as a common control gate electrode for the plurality of vertical memory devices.

Each memory stack structure 55 comprises a plurality of memory cells (as embodied as portions of the memory material layer located at levels of the electrically conductive layers 46) arranged in a vertical string extending along a direction substantially perpendicular to a top surface of the substrate 8. The plurality of memory cells is positioned at levels of the electrically conductive layers 46.

Figure 12A:
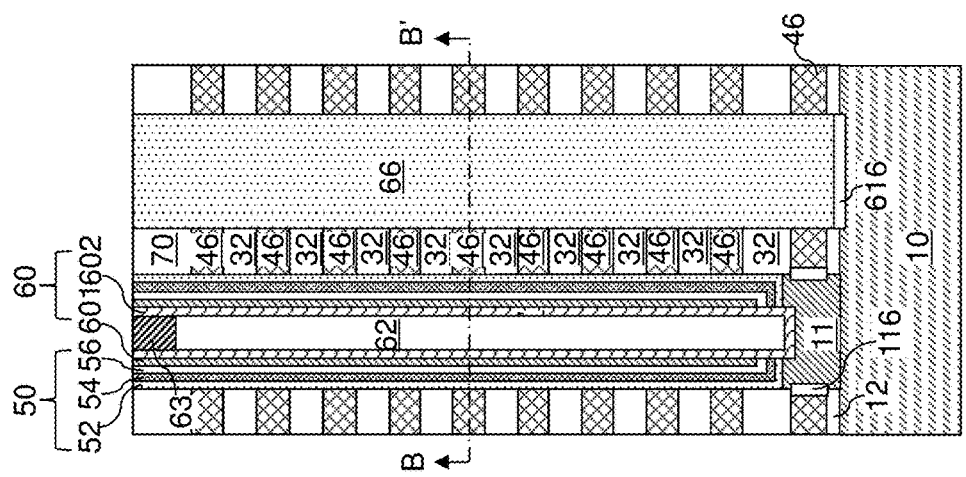
FIG. 12A is a vertical cross-sectional view of the region R of the exemplary structure after formation of dielectric pillar structures in the second subset of openings according to an embodiment of the present disclosure.
Figure 12B:
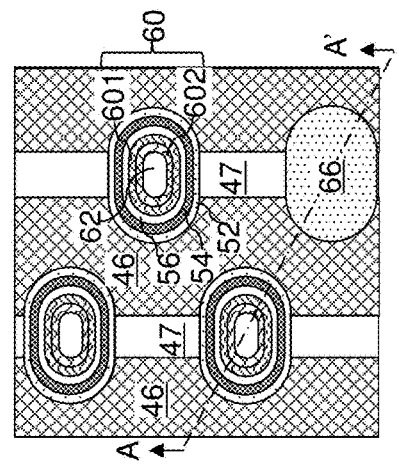
FIG. 12B is a horizontal cross-sectional view of the exemplary structure along the plane B-B' in FIG. 12A. The vertical plane A-A' corresponds to the plane of the vertical cross-sectional view of FIG. 12A.

Referring to FIGS. 12A and 12B, a dielectric material is deposited in the access openings 59 by a conformal deposition process. The dielectric material can include, for example, doped silicate glass, undoped silicate glass, or organosilicate glass. Examples of doped silicate glass materials include borosilicate glass, phosphosilicate glass, borophosphosilicate glass, and fluorosilicate glass. Optionally, a dielectric liner (not shown) including a diffusion barrier material (such as silicon nitride) can be formed in the access openings 59 prior to deposition of the dielectric material. Excess portions of the deposited dielectric material can be removed from above a horizontal plane including the top surface of the insulating cap layer 70 by a planarization process. For example, a recess etch or chemical mechanical planarization (CMP) can be performed to remove the excess portions of the deposited dielectric material. Each remaining portion of the dielectric material in the access openings 59 constitutes a dielectric pillar structure 66.

In one embodiment, the access openings 59 (which are a through-stack opening 49 within the second subset of through-stack openings 49) can have the same volume as each through-stack opening 49 within the first subset of through-stack openings 49. In this case, each dielectric pillar structure 66 can have substantially the same volume as a combination of an epitaxial channel portion 11, a memory film 50, a semiconductor channel 60, a dielectric core 62, and a drain region 63. As used herein, two elements have a substantially same volume if the volumes of the two elements differ by less than 5% from the average of the volumes of the two elements. In one embodiment, a dielectric semiconductor compound region 616 including a dielectric compound (such as silicon oxide or silicon nitride) of the semiconductor material in the semiconductor material layer 10 can be provided between each dielectric pillar structure 66 and the semiconductor material layer 10. In one embodiment, the dielectric pillar structures 66 can have a different composition than the dielectric semiconductor compound regions 616. For example, the dielectric pillar structures 66 can include a doped silicate glass material, and the dielectric semiconductor compound regions 616 can consist essentially of thermal silicon oxide, i.e., $SiO_2$.

Figure 13:
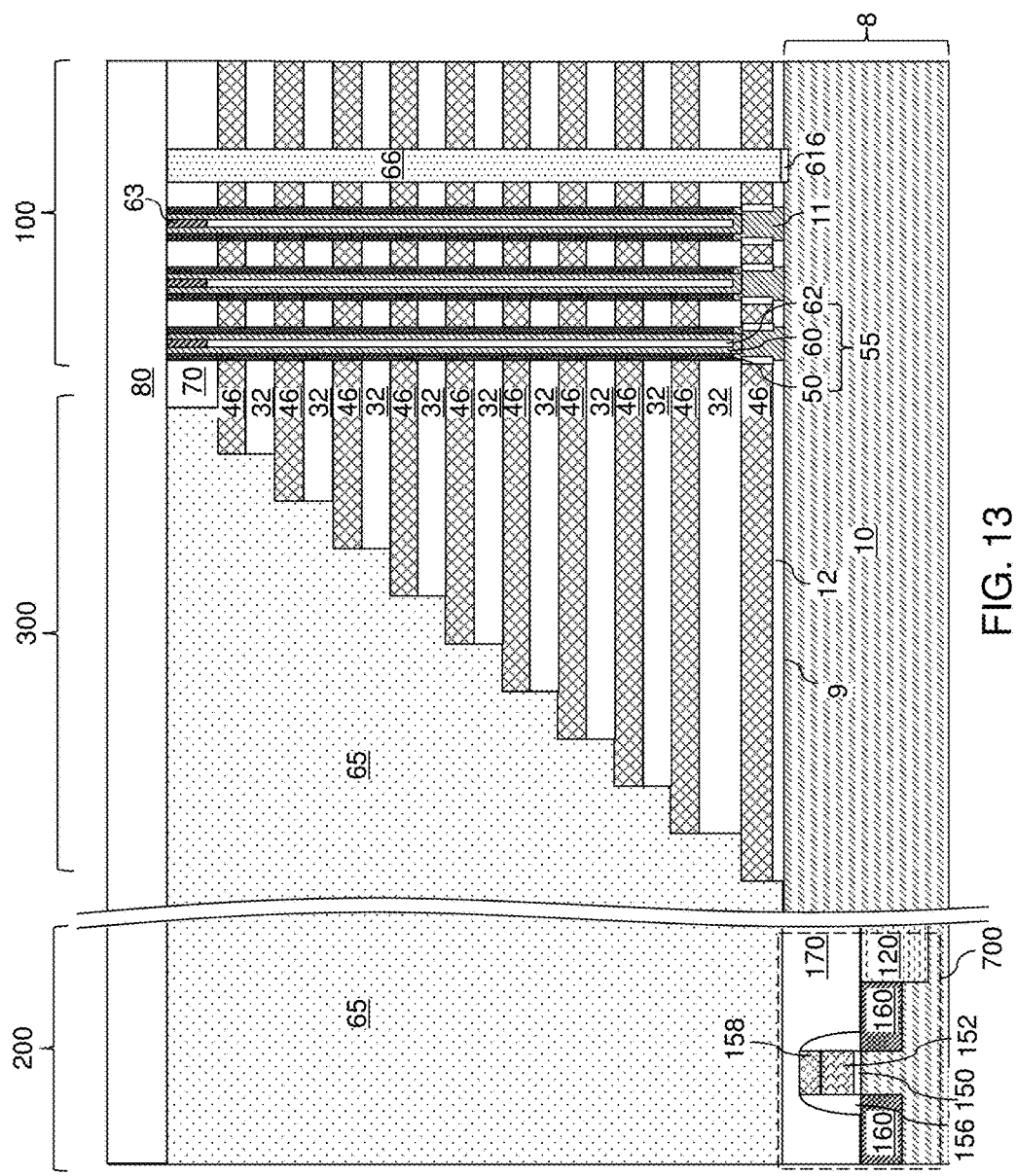
FIG. 13 is a vertical cross-sectional view of the exemplary structure after formation of a contact level dielectric layer according to an embodiment of the present disclosure.

Referring to FIG. 13, a contact level dielectric layer 80 may be formed over the insulating cap layer 70, the memory stack structures 55, the dielectric pillar structures 66, and the retro-stepped dielectric material portion 65. In one embodiment, the contact level dielectric layer 80 may be formed after formation of the dielectric pillar structures 66 as a separate structure, and may have a different composition than the dielectric pillar structures 66. In another embodiment, the contact level dielectric layer 80 and the at least one dielectric pillar structures 66 can be formed as a single continuous structure of integral construction, i.e., without any material interface therebetween. In this case, the contact level dielectric layer 80 can be formed by not planarizing the deposited dielectric material of the dielectric pillar structures 66 from above the insulating cap layer 70. The contact level dielectric layer 80 can include any other material that can be employed for the dielectric pillar structures 66. For example, the dielectric pillar structures 66 can include any of doped silicate glass, undoped silicate glass, and organosilicate glass.

Figure 14A:
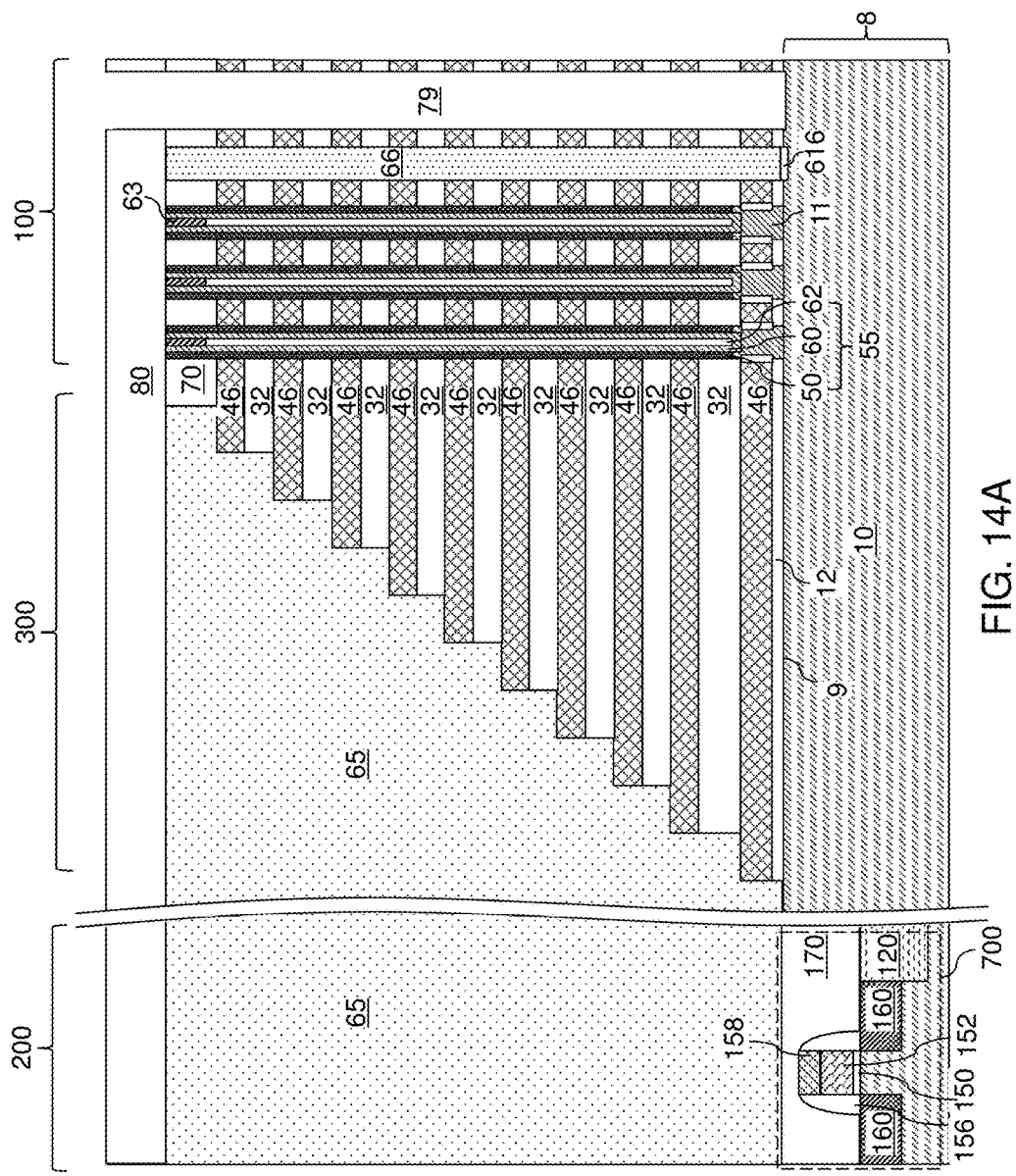
FIG. 14A is a vertical cross-sectional view of the exemplary structure after formation of a backside trench according to an embodiment of the present disclosure.
Figure 14B:
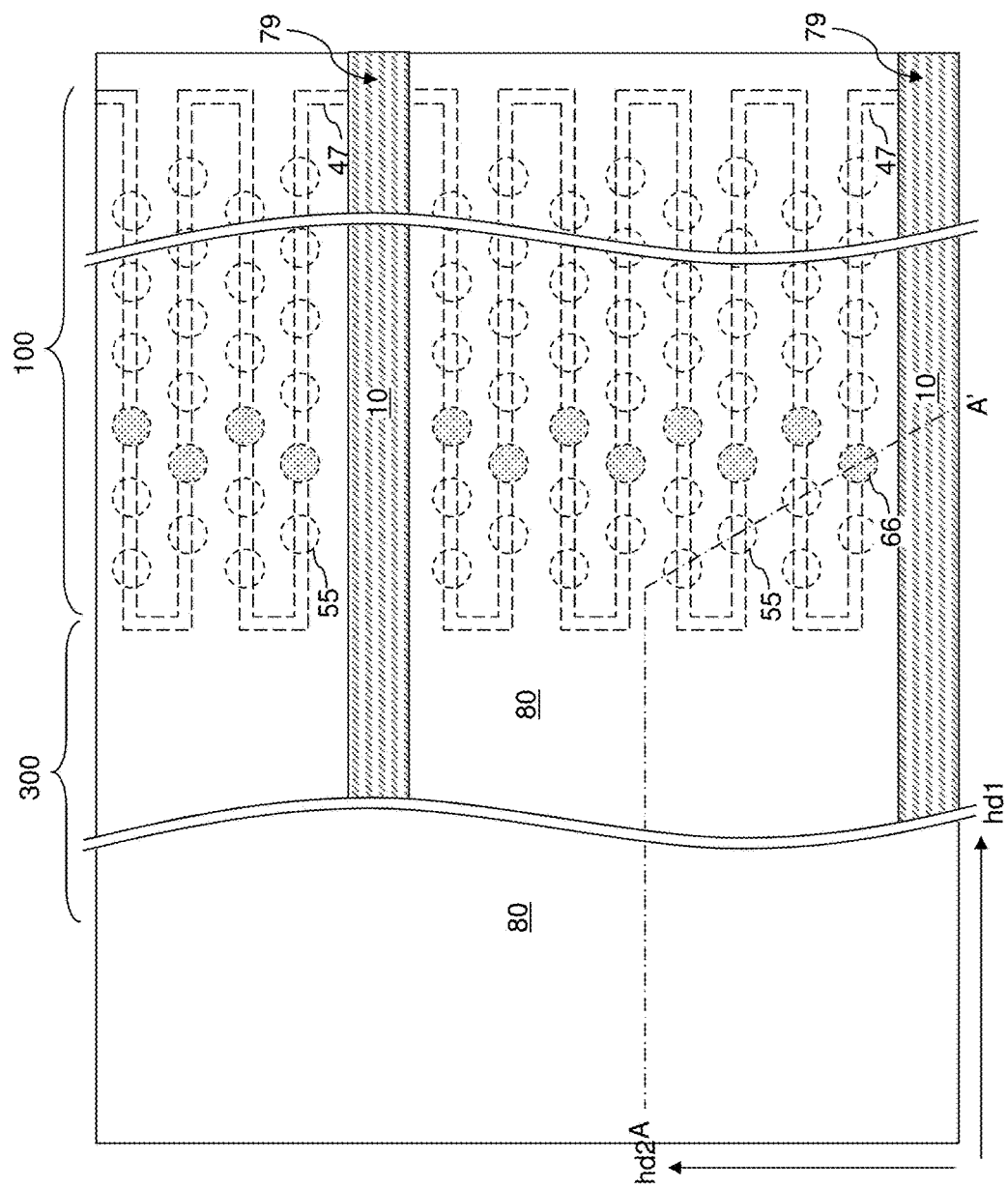
FIG. 14B is a top-down view of the exemplary structure of FIG. 14A. The vertical plane A-A' corresponds to the plane of the vertical cross-sectional view of FIG. 14A.
Figure 14C:
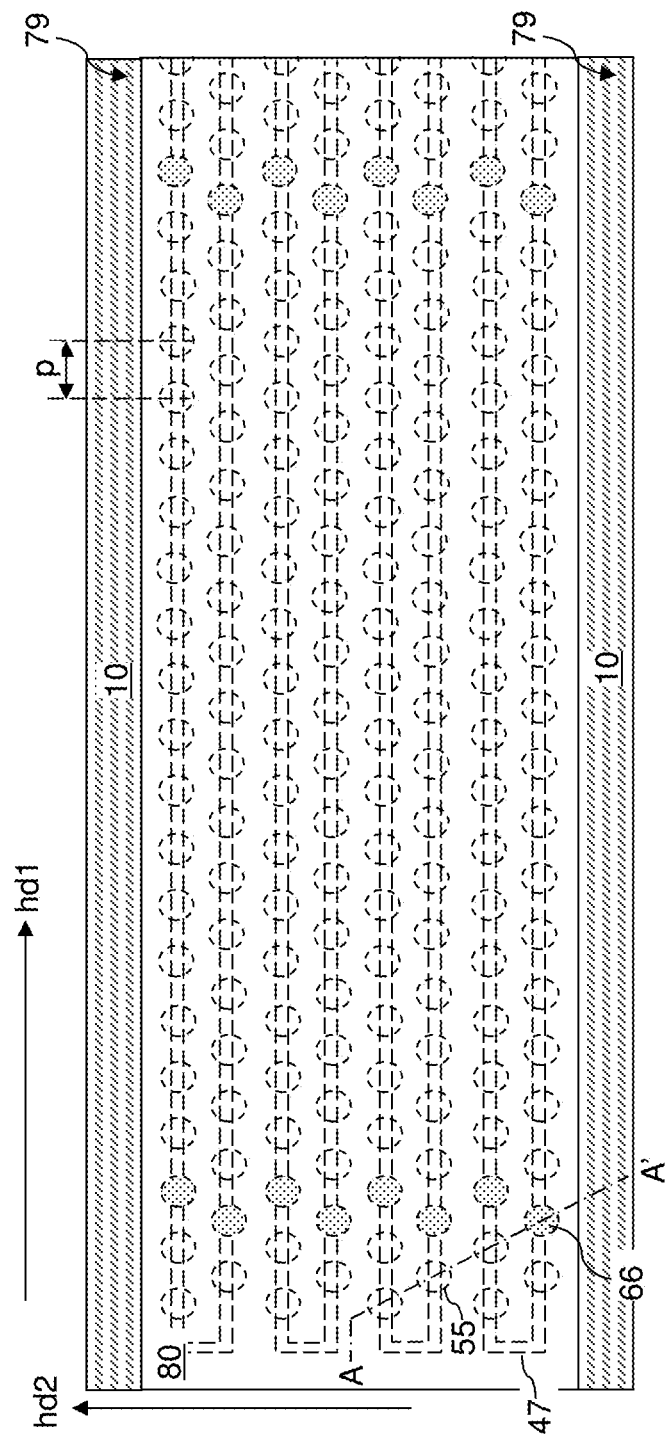
FIG. 14C is a top-down view of an array region of the exemplary structure of FIGS. 14A and 14B according to an embodiment of the present disclosure.
Figure 14D:
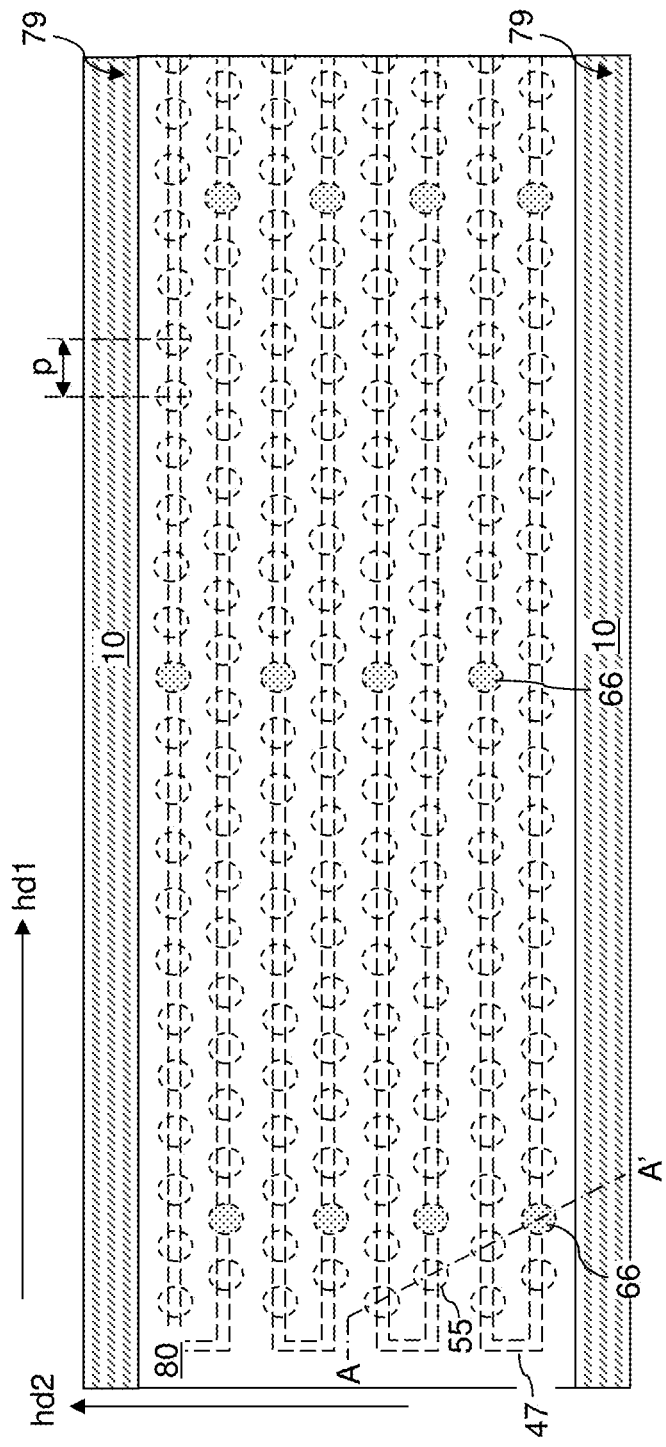
FIG. 14D is a top-down view of an array region of an alternative configuration for the exemplary structure of FIGS. 14A and 14B according to an embodiment of the present disclosure.

Referring to FIGS. 14A-14D, source electrode (or source local interconnect) openings 79 can be formed through the optional contact level dielectric layer 80, the insulating cap layer 70, the alternating stack (32, 42), and the gate dielectric layer 12. The openings 79 can have any suitable shape, such as circular, rectangular or elongated trench shape. For example, in one embodiment, the openings 79 may comprise backside trenches 79. FIG. 14A is a vertical cross-sectional view of the exemplary structure, and FIG. 14B is a top-down view of the exemplary structure of FIG. 14A. FIGS. 14C and 14D provide additional top-down views of two different configurations for the arrangement of the dielectric pillar structures 66 that are compatible with the exemplary structure illustrated in FIGS. 14A and 14B. In other words, FIG. 14C illustrates a first configuration for memory stack structures 55 and dielectric pillar structures 66, and FIG. 14D illustrates a second configuration for memory stack structures 55 and dielectric pillar structures 66. FIGS. 14C and 14D illustrate a portion of the memory array region 100 in two exemplary configurations of the exemplary structure.

Each of the backside trenches 79 can extend horizontally along the first horizontal direction hd1. Each layer within the alternating stack (32, 46) is divided into multiple portions along the second horizontal direction hd2 that is perpendicular to the first horizontal direction hd1 by the backside trenches 79.

For example, a photoresist layer (not shown) can be applied over the entire set of the spacer material layers 42 and the insulating layers 32, and can be lithographically patterned to form at least one elongated opening extending along the first horizontal direction hd1. The pattern in the photoresist layer can be transferred through the optional contact level dielectric layer 80, the insulating cap layer 70, the alternating stack (32, 46), the gate dielectric layer 12, and the retro-stepped dielectric material portion 65 employing an anisotropic etch to form the backside trenches 79, which extends at least to the top surface of the substrate 8. In one embodiment, the backside trenches 79 can include a source contact opening in which a backside contact via structure can be subsequently formed. A top surface of the semiconductor material layer 10 can be physically exposed at the bottom of each backside trench 79.

The backside trenches 79 are formed after formation of the dielectric pillar structures 66. In one embodiment, the array of through-stack openings 49 can be formed as a two-dimensional periodic array including rows of through-stack openings 49, and each row of through-stack openings 49 can extend along the first horizontal direction hd1, and can be laterally spaced from adjacent rows of through-stack openings 49 along a second horizontal direction hd2 that is perpendicular to the first horizontal direction hd1. In this case, the plurality of dielectric pillar structures 66 can be arranged as another periodic two-dimensional array having a greater pitch for a unit cell thereof than a unit cell of the array of openings.

For example, every N-th through-stack opening 49 along the first horizontal direction hd1 can be filled with a respective dielectric pillar structure 66 within each row, while the rest of the through-stack openings 49 within the same row can be filled with respective memory stack structures 55. The number N can be in a range from 3 to 20, and may be in a range from 5 to 12. In the configurations illustrated in FIGS. 14C and 14D, the number N is 9. The number N can be the same for each row. The dielectric pillar structures 66 in each neighboring pair of rows may be located in proximity to each other as illustrated in FIG. 14C, or can be offset along the first horizontal direction hd1 to provide maximal separation as illustrated in FIG. 14D. Other placement schemes for the dielectric pillar structures 66 can also be employed provided that the maximum distance between a memory opening (i.e., a through-stack opening 49 within the first subset of through-stack openings 49) and the most proximal access opening 59 does not exceed a predetermined maximum lateral distance, which can be on the order of N/2 times the pitch p of the through-stack openings 49 along the first horizontal direction.

Figure 15:
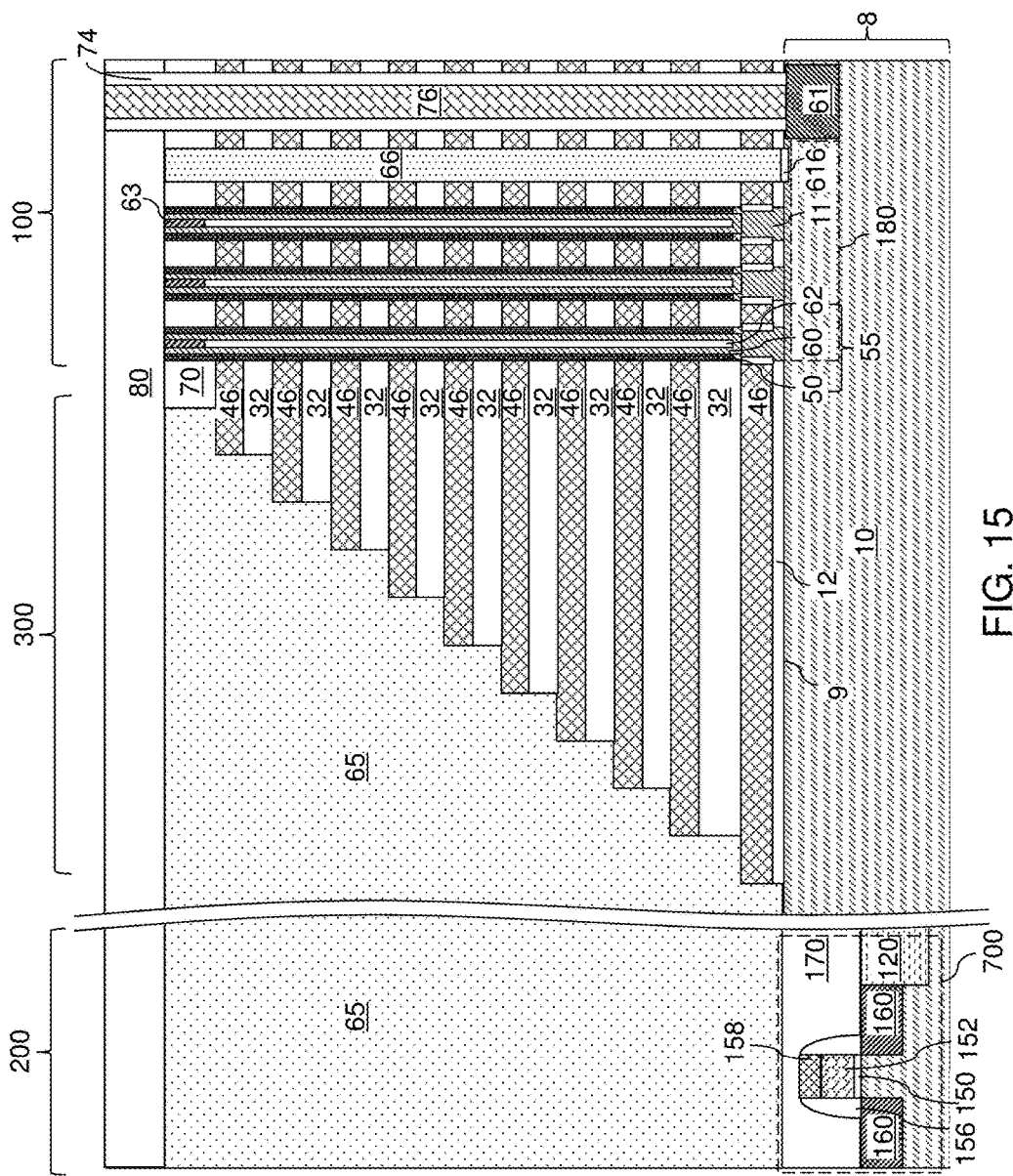
FIG. 15 is a vertical cross-sectional view of the exemplary structure after formation of a source region, an insulating spacer, and a backside contact via structure according to an embodiment of the present disclosure.

Referring to FIG. 15, an insulating material layer can be formed in each backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 80 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate 8 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 180 for a plurality of field effect transistors. The horizontal semiconductor channel 180 is connected to multiple vertical semiconductor channels 60 through respective epitaxial channel portions 11. The horizontal semiconductor channel 180 contacts the source region 61 and the plurality of epitaxial channel portions 11. A bottommost electrically conductive layer 46 can function as a select gate electrode for the field effect transistors.

A backside contact via structure 76 can be formed within each cavity. Each backside contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the electrically conductive layers 46 and the insulating layers 32 as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 extends through the alternating stack (32, 46) and the gate dielectric layer 12, and contacts a top surface of the source region 61.

Figure 16:
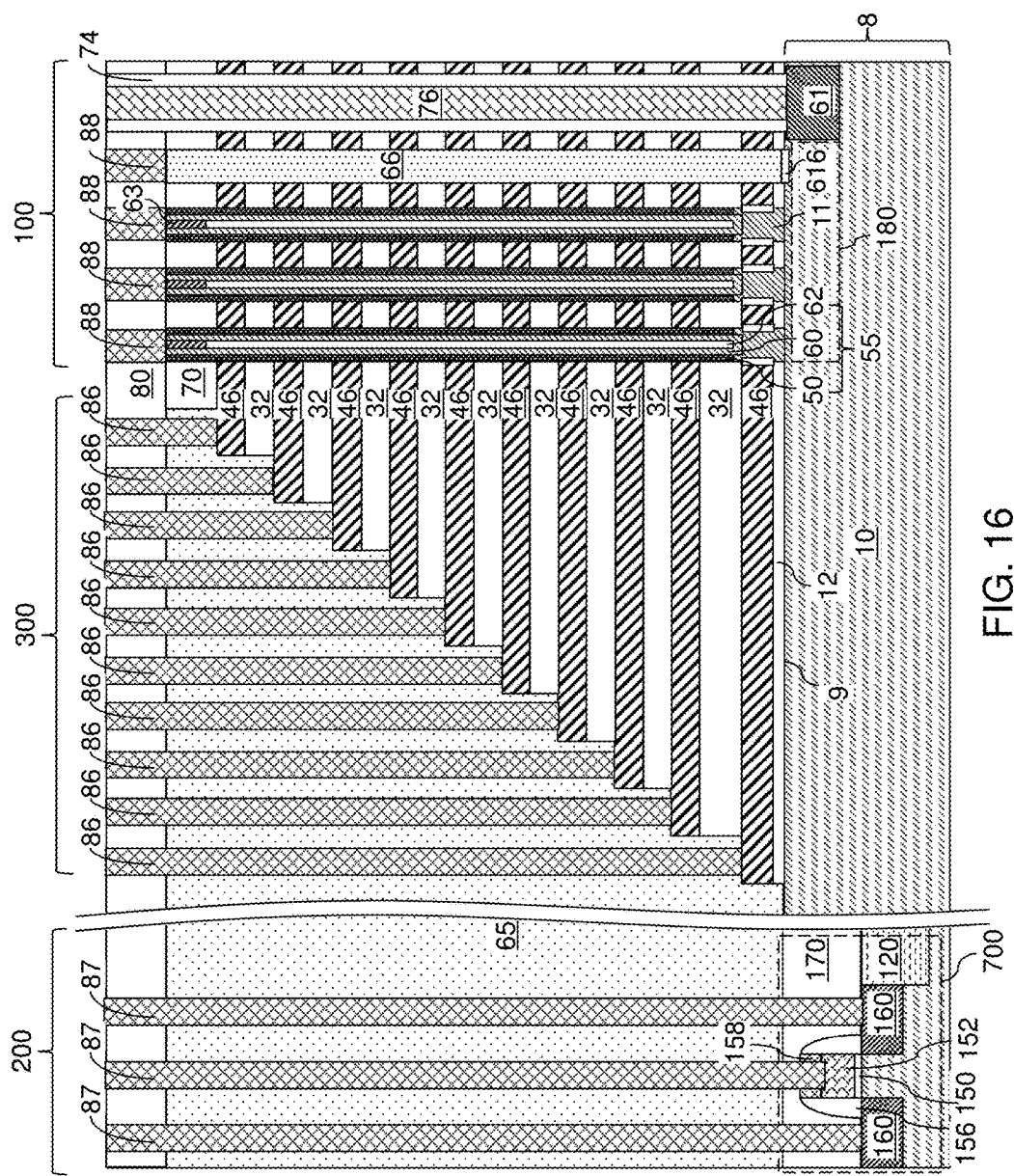
FIG. 16 is a vertical cross-sectional view of the exemplary structure after formation of additional contact via structures according to an embodiment of the present disclosure.

Referring to FIG. 16, additional contact via structures (86, 87, 88) can be formed through the contact level dielectric layer 80, and optionally through the retro-stepped dielectric material portion 65. For example, drain contact via structures 88 can be formed through the contact level dielectric layer 80 on each drain region 63. Control gate contact via structures 86 can be formed on the electrically conductive layers 46 through the contact level dielectric layer 80, and through the retro-stepped dielectric material portion 65. Peripheral device contact via structures 87 can be formed through the retro-stepped dielectric material portion 65 directly on respective nodes of the peripheral devices.

FIG. 17 is a see-through top-down view in which dielectric material layers overlying a topmost electrically conductive layer 46 have been omitted for clarity. Elongated contact via structures 92 that are elongated along the second horizontal direction hd2 can be formed on each drain contact via structure 88 (not shown in FIG. 17, See FIG. 16). While the elongated contact via structures 92 are shown only over four memory stack structures 55 for illustrative purposes, it is understood that the elongated contact via structures 92 can be formed over each memory stack structure 55, e.g., on each drain contact via structure 88. Bit lines 92 extending along the second horizontal direction hd2 can be formed directly on each elongated contact via structure 92. Each drain region 63 is electrically shorted to a respective bit line 92. Elongated contact via structures 92 may not be provided over the dielectric pillar structures 66.

A first row 155 and second row 255 of memory stack structures 55 and at least one dielectric pillar structure 66 extend through the respective first and second separator insulator structures (47A, 47B). A continuous first control gate electrode 461 extends between the first separator structure 47A and the second separator structure 47B. Control gate electrode 461 is located adjacent to a first (right) side of the first separator structure 47A, adjacent to a first (right) side of the first row 155 of the memory stack structures, adjacent to a first (left) side of the second separator structure 47B, and adjacent to a first (left) side of the second row 255 of the memory stack structures. A second control gate electrode 462 is located adjacent to a second (left) side of the first separator structure 47A, and adjacent to the second (left) side of the first row 155 of the memory stack structures. A third control gate electrode 463 is located adjacent to a second (right) side of the second row 255 of the memory stack structures, and adjacent to a second (right) side of the second separator structure 47B. Electrodes 462 and 463 may comprise finger portions of the same comb shaped word line 46B, while electrode 461 may comprise a finger portion of a different comb shaped word line 46A.

Each electrically conductive layer 46 (i.e., each of the word-line-level electrically conductive layers 46) formed within the alternating stack (32, 46) includes two physically disjoined portions (46A, 46B) between each optional neighboring pair of backside trenches (which are filled with the insulating spacers 74 and the backside contact structures 76) that are laterally spaced from each other by a subset of the memory stack structures 55 and portions of the separator insulator structures 47. The two physically disjoined portions (46A, 46B) of each electrically conductive layer 46 comprises two interdigitated electrically conductive portions including multiple fingers (461, 462, 463, 464, 465) that extend along the first horizontal direction hd1. Each of the two interdigitated electrically conductive portions (46A, 46B) includes concave vertical sidewalls 751 that contact respective memory stack structures 55 and are adjoined among one another by planar vertical sidewalls 752 that extend along the first horizontal direction hd1. Multiple instances of the unit structure US can be repeated with periodicity along the second horizontal direction hd2.

Referring collectively to FIGS. 16 and 17, the exemplary structure of the present disclosure can include a three-dimensional memory device. The three-dimensional memory device can include an alternating stack (32, 46) of insulating layers 32 and electrically conductive layers 46 located over a substrate 8; an array of openings 49 extending through the alternating stack (32, 46); a plurality of memory stack structures 55 located in a first subset of the array of openings 49, wherein each of the plurality of memory stack structures 55 comprises a plurality of memory cells (e.g., portions of the memory material layer 54 at levels of the electrically conductive layers 46) arranged in a vertical string extending along a direction substantially perpendicular to a top surface of the substrate 8, and the plurality of memory cells is positioned at levels of the electrically conductive layers 46; and a plurality of dielectric pillar structures 66 located in a second subset of the array of openings 49 (which are the access openings 59).

In one embodiment, each of the plurality of dielectric pillar structures 66 extend through an entirety of the alternating stack (32, 46). In one embodiment, each of the plurality of memory stack structures 55 comprises a vertical semiconductor channel 60 extending through the alternating stack (32, 46), and a drain region 63 is located on an upper end of each of the vertical semiconductor channels 60. In one embodiment, each drain region 63 has a top surface within a horizontal plane including top surfaces of the plurality of dielectric pillar structures 66 (which can be the top surface of the insulating cap layer 70).

In one embodiment, all openings in the array of openings 49 can have a substantially same shape and a substantially same volume. In one embodiment, each of the dielectric pillar structures 66 can contact sidewalls of the electrically conductive layers 46 within the alternating stack (32, 46).

In one embodiment, the three-dimensional memory device can comprise separator insulator structures 47 vertically extending through the alternating stack (32, 46). Each of the plurality of memory stack structures 55 and the plurality of dielectric pillar structures 66 contacts sidewalls of a respective subset of the separator insulator structures 47. In one embodiment, each of the electrically conductive layers 46 in the alternating stack (32, 46) can comprise a respective set of interdigitated electrically conductive portions (46A, 46B) including multiple fingers (461, 462, 263, 264, 265) that extend along a first horizontal direction hd1. The separator insulator structures 47, the plurality of memory stack structures 55, and the plurality of dielectric pillar structures 66 collectively separate each neighboring pair of fingers (461, 462, 263, 264, 265) of the interdigitated electrically conductive portions (46A, 46B).

A set of interdigitated electrically conductive portions (46A, 46B) can be located between each neighboring pair of backside contact via structures 76 if the unit structure US of FIG. 17 is repeated along the second horizontal direction hd2. In one embodiment, the three-dimensional memory device comprises a backside contact via structure 76 laterally extending along the first horizontal direction hd1 and laterally separating two sets of interdigitated electrically conductive portions (46A, 46B) along a second horizontal direction hd2 that is perpendicular to the first horizontal direction hd1. In this case, one set of interdigitated electrically conductive portions (46A, 46B) can be disposed on one side of the backside contact via structure 76, and another set of interdigitated electrically conductive portions (46A, 46B) can be located on the other side of the backside contact via structure 76.

In one embodiment, each of the plurality of memory stack structures 55 can contact sidewalls of a respective pair of separator insulator structures 47, and each of the plurality of dielectric pillar structures 66 can contact sidewalls of a respective pair of separator insulator structures 47.

In one embodiment, the total number of the plurality of dielectric pillar structures 66 in the three-dimensional memory device can be in a range from 1% to 20% of the total number of the memory stack structures 55 in the three-dimensional memory device.

In one embodiment, the array of openings 49 can be a two-dimensional periodic array including rows of through-stack openings 49. Each row of openings can extend along a first horizontal direction hd1 and is laterally spaced from adjacent rows of through-stack openings 49 along a second horizontal direction hd2 that is perpendicular to the first horizontal direction hd1. In one embodiment, the plurality of dielectric pillar structures 66 can be arranged as another periodic two-dimensional array having a greater pitch for a unit cell thereof than a unit cell of the array of openings 49.

In one embodiment, the alternating stack (32, 42) can comprise a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region can include stepped surfaces of the alternating stack (32, 46) that continuously extend from a bottommost layer within the alternating stack (32, 46) to a topmost layer within the alternating stack (32, 46).

In one embodiment, the three-dimensional memory device comprises a vertical NAND device located over the substrate 8. The electrically conductive layers 46 comprise, or are electrically connected to, a respective word line of the NAND device. The at least one lower-select-gate-level electrically conductive layer comprises a select gate of the vertical NAND device. The substrate 8 can comprise a silicon substrate. The vertical NAND device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon.

In one embodiment, the array of monolithic three-dimensional NAND strings comprises a plurality of semiconductor channels (180, 11, 60). At least one end portion (e.g., a vertical semiconductor channel 60) of each of the plurality of semiconductor channels (180, 11, 60) extends substantially perpendicular to a top surface of the substrate 8. The array of monolithic three-dimensional NAND strings comprises a plurality of charge storage elements (as embodied as portions of the memory material layer 54 located at each level of the electrically conductive layers 46), each charge storage element located adjacent to a respective one of the plurality of semiconductor channels. The array of monolithic three-dimensional NAND strings comprises a plurality of control gate electrodes (as embodied as portions of the electrically conductive layers 46) having a strip shape extending substantially parallel to the top surface of the substrate 8. The plurality of control gate electrodes comprise at least a first control gate electrode located in a first device level and a second control gate electrode located in a second device level.

In one embodiment, the metal contamination of the memory openings and the memory stack structures located in the memory openings can be avoided by not using the memory openings for replacement of the sacrificial material layers with electrically conductive layers. In another embodiment, by distributing the access openings across the entirety of the openings, eliminates the need to employ the optional backside trenches for replacement of the sacrificial material layers. If the backside trenches are present, then the size and lateral extent of backside trenches can be reduced to a level sufficient to accommodate only backside contact via structures. Furthermore, if the backside trenches are present, then more rows of openings may be formed between each pair of adjacent backside trenches than if the backside trenches were employed for replacement of the sacrificial material layers.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and electrically conductive layers located over a substrate;
    an array of openings extending through the alternating stack;
    a plurality of memory stack structures located in a first subset of the array of openings, wherein each of the plurality of memory stack structures comprises a memory film and a vertical semiconductor channel extending through the alternating stack;
    a plurality of dielectric pillar structures located in a second subset of the array of openings; and
    separator insulator structures vertically extending through the alternating stack, wherein each of the plurality of memory stack structures and the plurality of dielectric pillar structures contact sidewalls of a respective subset of the separator insulator structures; and
    wherein:
        each of the plurality of memory stack structures contacts sidewalls of a respective pair of separator insulator structures; and
        each of the plurality of dielectric pillar structures contacts sidewalls of a respective pair of separator insulator structures.

2. The three-dimensional memory device of claim 1, wherein each of the plurality of dielectric pillar structures extend through an entirety of the alternating stack.

3. The three-dimensional memory device of claim 1, further comprising a drain region is located on an upper end of each of the vertical semiconductor channels.

4. The three-dimensional memory device of claim 3, wherein each drain region has a top surface within a horizontal plane including top surfaces of the plurality of dielectric pillar structures.

5. The three-dimensional memory device of claim 1, wherein all openings in the array of openings has a substantially same shape and a substantially same volume.

6. The three-dimensional memory device of claim 1, wherein each of the dielectric pillar structures contacts sidewalls of the electrically conductive layers within the alternating stack.

7. The three-dimensional memory device of claim 1, wherein each of the electrically conductive layers in the alternating stack comprises a respective set of interdigitated electrically conductive portions including multiple fingers that extend along a first horizontal direction, wherein the separator insulator structures, the plurality of memory stack structures, and the plurality of dielectric pillar structures collectively separate each neighboring pair of fingers of the interdigitated electrically conductive portions.

8. The three-dimensional memory device of claim 1, wherein a total number of the plurality of dielectric pillar structures in the three-dimensional memory device is in a range from 1% to 20% of a total number of the memory stack structures in the three-dimensional memory device.

9. The three-dimensional memory device of claim 1, wherein the array of openings is a two-dimensional periodic array including rows of through-stack openings, wherein each row of openings extends along a first horizontal direction and is laterally spaced from adjacent rows of through-stack openings along a second horizontal direction that is perpendicular to the first horizontal direction.

10. The three-dimensional memory device of claim 9, wherein the plurality of dielectric pillar structures is arranged as another periodic two-dimensional array having a greater pitch for a unit cell thereof than a unit cell of the array of openings.

11. The three-dimensional memory device of claim 1, wherein the alternating stack comprises a terrace region in which each electrically conductive layer other than a topmost electrically conductive layer within the alternating stack laterally extends farther than any overlying electrically conductive layer within the alternating stack, and the terrace region includes stepped surfaces of the alternating stack that continuously extend from a bottommost layer within the alternating stack to a topmost layer within the alternating stack.

12. The three-dimensional memory device of claim 1, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

13. A three-dimensional memory device comprising:
an alternating stack of insulating layers and electrically conductive layers located over a substrate;
an array of openings extending through the alternating stack;
a plurality of memory stack structures located in a first subset of the array of openings, wherein each of the plurality of memory stack structures comprises a memory film and a vertical semiconductor channel extending through the alternating stack;
a plurality of dielectric pillar structures located in a second subset of the array of openings;
separator insulator structures vertically extending through the alternating stack, wherein each of the plurality of memory stack structures and the plurality of dielectric pillar structures contact sidewalls of a respective subset of the separator insulator structures;
wherein each of the electrically conductive layers in the alternating stack comprises a respective set of interdigitated electrically conductive portions including multiple fingers that extend along a first horizontal direction, wherein the separator insulator structures, the plurality of memory stack structures, and the plurality of dielectric pillar structures collectively separate each neighboring pair of fingers of the interdigitated electrically conductive portions; and
further comprising a backside contact via structure laterally extending along the first horizontal direction and laterally separating two sets of interdigitated electrically conductive portions along a second horizontal direction that is perpendicular to the first horizontal direction.

* * * * *